(12) United States Patent
Zhou

(10) Patent No.: US 11,799,018 B2
(45) Date of Patent: Oct. 24, 2023

(54) SEMICONDUCTOR STRUCTURE AND METHOD FOR FORMING THE SAME

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 317 days.

(21) Appl. No.: 16/996,206

(22) Filed: Aug. 18, 2020

(65) Prior Publication Data
US 2021/0057553 A1    Feb. 25, 2021

(30) Foreign Application Priority Data
Aug. 23, 2019   (CN) .......................... 201910784979.9

(51) Int. Cl.
*H01L 29/66*    (2006.01)
*H01L 29/78*    (2006.01)
(Continued)

(52) U.S. Cl.
CPC .................. *H01L 29/66803* (2013.01); *H01L 21/823412* (2013.01); *H01L 21/823418* (2013.01);
(Continued)

(58) Field of Classification Search
CPC ... H01L 21/02603; H01L 29/0669–068; H01L 29/0665; H01L 29/66439;
(Continued)

(56) References Cited

U.S. PATENT DOCUMENTS 8,778,768 B1 * 7/2014  Chang ................. H01L 29/0673
                                                       438/303
8,853,781 B2 * 10/2014  Cheng ................... H01L 29/785
                                                       257/352
(Continued)

*Primary Examiner* — Maliheh Malek
(74) *Attorney, Agent, or Firm* — Anova Law Group, PLLC

(57) ABSTRACT

A semiconductor structure includes a substrate; and a fin structure disposed on the substrate. The fin structure includes a channel region, a source region, and a drain region. The channel region is located between the source region and the drain region. The channel region includes a first nanowire and a second nanowire above the first nanowire. The first nanowire contains first threshold-voltage adjustment ions, and the second nanowire contains second threshold-voltage adjustment ions. A first opening is formed between the first nanowire and the substrate, and between the source region and the drain region, and a second opening is formed between the first nanowire and the second nanowire, and between the source region and the drain region. The first threshold-voltage adjustment ions are different from the second threshold-voltage adjustment ions in type, concentration, or a combination thereof.

10 Claims, 14 Drawing Sheets

(51) Int. Cl.
　　　H01L 21/8234　　(2006.01)
　　　H01L 29/06　　　(2006.01)
　　　H01L 29/417　　 (2006.01)
　　　H01L 21/02　　　(2006.01)

(52) U.S. Cl.
　　　CPC .. *H01L 21/823431* (2013.01); *H01L 29/0669* (2013.01); *H01L 29/41791* (2013.01); *H01L 29/7851* (2013.01)

(58) Field of Classification Search
　　　CPC ........... H01L 29/66469; H01L 29/7853; H01L 29/78687; H01L 29/78696; H01L 29/42392; H01L 29/775; H01L 29/413; H01L 29/0673; H01L 29/66545; H01L 29/0847; H01L 29/66742; H01L 29/0653; H01L 29/401; H01L 29/785; H01L 29/78618; H01L 29/66795; H01L 29/4966; H01L 29/6656; H01L 29/165; H01L 29/66553; H01L 29/513; H01L 29/1033; H01L 29/1079; H01L 29/42376; H01L 29/7848; H01L 29/78684; H01L 29/78654; H01L 29/4908; H01L 29/66772; H01L 29/6681; H01L 29/0649; H01L 29/20; H01L 29/16; H01L 29/517; H01L 29/66522; H01L 29/45; H01L 29/6659; H01L 29/78681; H01L 29/161; H01L 29/6653; H01L 29/78; H01L 29/7851; H01L 29/78651; H01L 29/1037; H01L 29/495; H01L 29/665; H01L 29/41733; H01L 29/7843; H01L 29/04; H01L 29/267; H01L 29/41725; H01L 29/4232; H01L 29/42364; H01L 29/4916; H01L 29/7845; H01L 29/205; H01L 29/41791; H01L 29/7855; H01L 29/78621; H01L 21/02532; H01L 21/823807; H01L 21/823842; H01L 21/823412; H01L 21/823431; H01L 21/28088; H01L 21/0217; H01L 21/823418; H01L 21/31111; H01L 21/823814; H01L 21/823857; H01L 21/28518; H01L 21/823462; H01L 21/02236; H01L 21/3065; H01L 21/823481; H01L 21/30604; H01L 21/8221; H01L 21/0262; H01L 21/82345; H01L 21/823878; H01L 21/84; H01L 21/02488; H01L 21/308; H01L 21/823437; H01L 21/823864; H01L 21/845; H01L 21/02164; H01L 21/0245; H01L 21/02507; H01L 21/3081; H01L 21/76897; H01L 21/823456; H01L 21/823468; H01L 21/82385; H01L 21/0228; H01L 21/265; H01L 21/28185; H01L 21/31116; H01L 21/76224; H01L 21/8252; H01L 21/2236; H01L 21/28556; H01L 21/3086; H01L 21/76805; H01L 21/8258; H01L 27/092; H01L 27/088; H01L 27/0924; H01L 27/1211; H01L 27/1222; H01L 27/1225; H01L 27/1218; H01L 27/124; H01L 27/1248; H01L 27/1259; H01L 27/127; B82Y 10/00; B82Y 40/00

See application file for complete search history.

(56) References Cited

U.S. PATENT DOCUMENTS

| | | | | |
|---|---|---|---|---|
| 8,872,172 B2* | 10/2014 | Cheng | ............... | H01L 29/66575 |
| | | | | 438/479 |
| 9,224,810 B2* | 12/2015 | Kim | ............... | H01L 21/8238 |
| 9,362,355 B1* | 6/2016 | Cheng | ............... | H01L 29/4991 |
| 9,472,555 B1* | 10/2016 | Balakrishnan | ........ | H01L 21/845 |
| 9,614,038 B2* | 4/2017 | Hong | ............... | H01L 29/4966 |
| 9,647,098 B2* | 5/2017 | Obradovic | ........... | H01L 21/8252 |
| 9,653,289 B1* | 5/2017 | Balakrishnan | ...... | H01L 29/4983 |
| 9,876,079 B2* | 1/2018 | Hong | ............... | H01L 21/265 |
| 10,074,575 B1* | 9/2018 | Guillorn | ........... | H01L 21/823821 |
| 10,083,879 B2* | 9/2018 | Xiao | ............... | H01L 29/42392 |
| 10,177,149 B2* | 1/2019 | Kim | ............... | H01L 29/42364 |
| 10,243,054 B1* | 3/2019 | Cheng | ............... | H01L 27/088 |
| 10,263,100 B1* | 4/2019 | Bi | ............... | H01L 29/66439 |
| 10,304,926 B2* | 5/2019 | Zhou | ............... | H01L 21/3081 |
| 10,388,732 B1* | 8/2019 | Frougier | ............ | H01L 29/0649 |
| 10,388,755 B1* | 8/2019 | Lee | ............... | H01L 21/2822 |
| 10,424,639 B1* | 9/2019 | Miao | ............... | H01L 21/0228 |
| 10,546,957 B2* | 1/2020 | Xu | ............... | H01L 21/30604 |
| 10,566,330 B2* | 2/2020 | Rodder | ............... | H01L 29/0847 |
| 10,651,291 B2* | 5/2020 | Frougier | ............ | H01L 29/78696 |
| 10,700,064 B1* | 6/2020 | Zhang | ............... | H01L 29/78 |
| 10,741,456 B2* | 8/2020 | Cheng | ............... | H01L 27/0924 |
| 10,879,394 B2* | 12/2020 | Yeh | ............... | H01L 29/78696 |
| 10,886,369 B2* | 1/2021 | Zhang | ............... | H01L 29/66439 |
| 10,937,704 B1* | 3/2021 | Chiang | ........... | H01L 21/823821 |
| 11,038,044 B2* | 6/2021 | Cheng | ............... | H01L 29/165 |
| 11,062,937 B2* | 7/2021 | Cheng | ............... | H01L 29/0673 |
| 11,069,681 B2* | 7/2021 | Shin | ............... | H01L 29/785 |
| 11,145,734 B1* | 10/2021 | Yu | ............... | H01L 29/775 |
| 11,152,358 B2* | 10/2021 | Huang | ............... | H01L 21/02603 |
| 11,158,727 B2* | 10/2021 | Wang | ............... | H01L 29/66439 |
| 11,164,941 B2* | 11/2021 | Zhang | ........... | H01L 21/823412 |
| 11,211,456 B2* | 12/2021 | Jung | ............... | H01L 29/1037 |
| 11,222,963 B2* | 1/2022 | More | ............... | H01L 29/41791 |
| 11,282,928 B2* | 3/2022 | Cho | ............... | H01L 29/775 |
| 11,289,573 B2* | 3/2022 | Wu | ............... | H01L 21/823418 |
| 11,289,586 B2* | 3/2022 | Lo | ............... | H01L 29/7851 |
| 11,295,988 B2* | 4/2022 | Xie | ............... | H01L 21/823814 |
| 11,315,785 B2* | 4/2022 | Chiang | ............ | H01L 29/42392 |
| 11,362,091 B2* | 6/2022 | Fulford | ............ | H01L 27/0886 |
| 11,367,662 B2* | 6/2022 | Dentoni Litta | ............ | |
| | | | | H01L 21/823828 |
| 11,387,319 B2* | 7/2022 | Xie | ............... | H01L 21/02601 |
| 11,417,777 B2* | 8/2022 | Chang | ............... | H01L 21/3065 |
| 11,424,242 B2* | 8/2022 | Ju | ............... | H01L 29/785 |
| 11,502,079 B2* | 11/2022 | Song | ............... | H01L 27/0922 |
| 11,502,168 B2* | 11/2022 | Hsu | ............... | H01L 29/42392 |
| 2011/0133169 A1* | 6/2011 | Bangsaruntip | ...... | H01L 29/0673 |
| | | | | 257/E29.255 |
| 2014/0151639 A1* | 6/2014 | Chang | ............... | H01L 29/0673 |
| | | | | 257/27 |
| 2014/0332753 A1* | 11/2014 | Xiao | ............... | H01L 29/42392 |
| | | | | 438/197 |
| 2015/0295036 A1* | 10/2015 | Hong | ............... | H01L 29/20 |
| | | | | 438/149 |
| 2015/0295084 A1* | 10/2015 | Obradovic | ........... | H01L 29/775 |
| | | | | 257/347 |
| 2016/0020305 A1* | 1/2016 | Obradovic | ........... | H01L 29/7391 |
| | | | | 438/157 |
| 2016/0071729 A1* | 3/2016 | Hatcher | ............ | H01L 29/42392 |
| | | | | 438/157 |
| 2017/0162452 A1* | 6/2017 | Xiao | ............... | H01L 27/1222 |
| 2017/0162579 A1* | 6/2017 | Choi | ............... | H01L 29/0673 |
| 2017/0162652 A1* | 6/2017 | Hong | ............... | H01L 29/4916 |
| 2017/0323941 A1* | 11/2017 | Obradovic | ........ | H01L 29/42392 |
| 2018/0097060 A1* | 4/2018 | Zhou | ............... | H01L 29/785 |
| 2018/0102359 A1* | 4/2018 | Cheng | ............... | H01L 27/0629 |
| 2019/0058052 A1* | 2/2019 | Frougier | ............ | H01L 29/0665 |
| 2019/0067441 A1* | 2/2019 | Yang | ............... | H01L 29/4908 |
| 2019/0081152 A1* | 3/2019 | Suh | ............... | H01L 21/28167 |
| 2019/0122937 A1* | 4/2019 | Cheng | ............ | H01L 21/823857 |
| 2019/0214502 A1* | 7/2019 | Xu | ............... | H01L 29/775 |
| 2019/0371888 A1* | 12/2019 | Zhang | ............... | H01L 29/775 |

(56) References Cited

U.S. PATENT DOCUMENTS

| | | | |
|---|---|---|---|
| 2019/0393097 A1* | 12/2019 | Tapily | H01L 29/775 |
| 2020/0006356 A1* | 1/2020 | Ando | H01L 27/1104 |
| 2020/0043808 A1* | 2/2020 | Bao | H01L 21/28088 |
| 2020/0044045 A1* | 2/2020 | Wang | H01L 29/66439 |
| 2020/0051981 A1* | 2/2020 | Yang | H01L 29/7851 |
| 2020/0091149 A1* | 3/2020 | Lee | B82Y 10/00 |
| 2020/0126798 A1* | 4/2020 | Lin | H01L 21/28518 |
| 2020/0135932 A1* | 4/2020 | Wang | H01L 29/66439 |
| 2020/0176613 A1* | 6/2020 | Barraud | H01L 29/78696 |
| 2020/0219775 A1* | 7/2020 | Pang | H01L 21/823842 |
| 2020/0251593 A1* | 8/2020 | Miao | H01L 21/823412 |
| 2020/0258995 A1* | 8/2020 | Bao | H01L 29/4966 |
| 2020/0273964 A1* | 8/2020 | Lin | H01L 29/785 |
| 2020/0294865 A1* | 9/2020 | Cheng | H01L 27/0924 |
| 2020/0294866 A1* | 9/2020 | Cheng | H01L 21/28088 |
| 2020/0365706 A1* | 11/2020 | Lee | H01L 29/78696 |
| 2020/0381305 A1* | 12/2020 | Ando | H01L 27/0886 |
| 2020/0381311 A1* | 12/2020 | Kim | H01L 21/28088 |
| 2021/0013107 A1* | 1/2021 | Gardner | H01L 27/088 |
| 2021/0013111 A1* | 1/2021 | Smith | H01L 27/0922 |
| 2021/0074548 A1* | 3/2021 | Lin | B82Y 10/00 |
| 2021/0134794 A1* | 5/2021 | Huang | 438/176 |
| 2021/0134950 A1* | 5/2021 | Hsu | H01L 27/092 |
| 2021/0134951 A1* | 5/2021 | Chen | H01L 21/823412 |
| 2021/0193842 A1* | 6/2021 | Wang | H01L 29/6653 |
| 2021/0210388 A1* | 7/2021 | Zhang | H01L 29/66439 |
| 2021/0210600 A1* | 7/2021 | Zhou | H01L 29/0673 |
| 2021/0249506 A1* | 8/2021 | Yeh | H01L 29/1079 |
| 2021/0265496 A1* | 8/2021 | Chu | H01L 29/4966 |
| 2021/0343858 A1* | 11/2021 | Wang | H01L 29/42392 |
| 2021/0391477 A1* | 12/2021 | Chang | H01L 29/7848 |
| 2021/0408230 A1* | 12/2021 | More | H01L 29/1079 |
| 2021/0408236 A1* | 12/2021 | Zhang | H01L 29/513 |
| 2021/0408257 A1* | 12/2021 | Thomas | H01L 21/8221 |
| 2021/0408259 A1* | 12/2021 | Cheng | H01L 21/32134 |
| 2022/0028899 A1* | 1/2022 | Chen | H01L 29/66439 |
| 2022/0037509 A1* | 2/2022 | Huang | H01L 29/66545 |
| 2022/0084830 A1* | 3/2022 | Hsu | H01L 21/0332 |
| 2022/0199472 A1* | 6/2022 | Chao | H01L 29/775 |
| 2022/0199620 A1* | 6/2022 | Thomas | H01L 29/775 |
| 2022/0199838 A1* | 6/2022 | Dorow | H01L 29/42392 |
| 2022/0278197 A1* | 9/2022 | Wang | H01L 29/42392 |
| 2022/0278218 A1* | 9/2022 | Chen | H01L 29/66439 |
| 2022/0310456 A1* | 9/2022 | Hall | H01L 21/823857 |
| 2022/0320089 A1* | 10/2022 | Chu | H01L 27/092 |
| 2022/0320282 A1* | 10/2022 | Reznicek | H01L 27/088 |
| 2022/0415931 A1* | 12/2022 | Park | H01L 21/823857 |
| 2023/0060757 A1* | 3/2023 | Lee | H01L 29/66795 |
| 2023/0062940 A1* | 3/2023 | Khaderbad | H01L 21/823821 |
| 2023/0071699 A1* | 3/2023 | Smith | H01L 29/0665 |
| 2023/0139258 A1* | 5/2023 | Hou | H01L 21/762 257/401 |
| 2023/0142732 A1* | 5/2023 | Ko | H01L 29/0673 438/154 |
| 2023/0154996 A1* | 5/2023 | Bao | H01L 29/0673 257/288 |
| 2023/0178618 A1* | 6/2023 | Bhuiyan | H01L 21/823412 257/288 |

* cited by examiner

SEMICONDUCTOR STRUCTURE AND METHOD FOR FORMING THE SAME

CROSS-REFERENCE TO RELATED APPLICATION

This application claims priority to Chinese Patent Application No. 201910784979.9, filed on Aug. 23, 2019, the entire content of which is incorporated herein by reference.

TECHNICAL FIELD

The present disclosure generally relates to the technical field of semiconductor manufacturing and, more particularly, to a semiconductor structure and a method for forming the same.

BACKGROUND

With the improvement of the semiconductor technology, the ability of planar metal-oxide-semiconductor (MOS) field-effect transistor (FET) in controlling the channel current becomes weak, causing serious current leakage. Fin field-effect transistor (Fin FET), as a multi-gate device, often includes a fin structure protruding from the surface of a semiconductor substrate, a gate structure covering a portion of the top and sidewall surfaces of the fin structure, and doped source-drain regions formed in the fin structure on the two sides of the gate structure. Compared to a planar metal-oxide-semiconductor (MOS) FET, the Fin FET demonstrates more desired ability in suppressing the short-channel effect, and has a greater operating current.

With further development of the semiconductor technology, the size of integrated circuit (IC) devices becomes smaller and smaller, and more challenges are generated when further increasing the operating current of existing Fin FETs. Specifically, since only an area near the top and sidewall surfaces of the fin structure is used as the channel region, the volume of the fin structure that is used as the channel region may be small, which is conducive to increasing the operating current of the Fin FET. Therefore, a Fin FET with a gate-all-around (GAA) structure is provided to increase the volume of the channel region, and thus further increase the operating current of the Fin FET.

However, the device performance of the Fin FET with the GAA structure according to existing technology still needs to be improved. The disclosed semiconductor structures and fabrication methods thereof are directed to solve one or more problems set forth above and other problems in the art.

SUMMARY

One aspect of the present disclosure provides a semiconductor structure. The semiconductor structure includes a substrate; and a fin structure disposed on the substrate. The fin structure includes a channel region, a source region, and a drain region. The channel region is located between the source region and the drain region. The channel region includes a first nanowire and a second nanowire above the first nanowire. The first nanowire contains first threshold-voltage adjustment ions, and the second nanowire contains second threshold-voltage adjustment ions. A first opening is formed between the first nanowire and the substrate, and between the source region and the drain region, and a second opening is formed between the first nanowire and the second nanowire, and between the source region and the drain region. The first threshold-voltage adjustment ions are different from the second threshold-voltage adjustment ions in type, concentration, or a combination thereof.

Optionally, the type of the first threshold-voltage adjustment ions is opposite to the type of the second threshold-voltage adjustment ions; when the semiconductor structure is N-type, the first threshold-voltage adjustment ions are N-type, and the second threshold-voltage adjustment ions are P-type; and when the semiconductor structure is P-type, the first threshold-voltage adjustment ions are P-type, and the second threshold-voltage adjustment ions are N-type.

Further, the concentration of the first threshold-voltage adjustment ions is in a range of approximately 5.0E17 to 7.0E19 atom/cm$^3$; and the concentration of the second threshold-voltage adjustment ions is in a range of 0 to approximately 4.0E19 atom/cm$^3$.

Optionally, the type of the first threshold-voltage adjustment ions is the same as the type of the second threshold-voltage adjustment ions; when the semiconductor structure is N-type, the first threshold-voltage adjustment ions and the second threshold-voltage adjustment ions are N-type; when the semiconductor structure is P-type, the first threshold-voltage adjustment ions and the second threshold-voltage adjustment ions are P-type; and the concentration of the first threshold-voltage adjustment ions is higher than the concentration of the second threshold-voltage adjustment ions.

Further, the concentration of the first threshold-voltage adjustment ions is in a range of approximately 1.5E18 to 1.0E20 atom/cm$^3$; and the concentration of the second threshold-voltage adjustment ions is in a range of 0 to approximately 8.0E19 atom/cm$^3$.

Optionally, the semiconductor structure further includes a first gate structure, formed in the first opening and across and surrounding the first nanowire, and including a first work function layer; and a second gate structure, formed in the second opening and across and surrounding the second nanowire, and including a second work function layer. The second work function layer is different from the first work function layer in work-function type, thickness, or a combination thereof.

Optionally, the type of the first work function layer is the same as the type of the second work function layer; when the semiconductor structure is N-type, the first work function layer and the second work function layer are made of an N-type work-function material; when the semiconductor structure is P-type, the first work function layer and the second work function layer are made of a P-type work-function material; and the thickness of the first work function layer is higher than the thickness of the second work function layer. The P-type work-function material includes tantalum nitride (TaN$_x$), aluminum nitride (AlN$_x$), or a combination thereof, and the N-type work-function material includes titanium aluminum alloy.

Further, The thickness of the first work function layer is in a range of approximately 25 Å to 120 Å; and the thickness of the second work function layer is in a range of 0 Å to approximately 100 Å.

Optionally, the type of the first work function layer is opposite to the type of the second work function layer; when the semiconductor structure is N-type, the first work function layer is made of an N-type work-function material, and the second work function layer is made of a P-type work-function material; and when the semiconductor structure is P-type, the first work function layer is made of the P-type work-function material, and the second work function layer is made of the N-type work-function material. The P-type work-function material includes tantalum nitride (TaN$_x$), aluminum nitride ($AlN_x$), or a combination thereof, and the N-type work-function material includes titanium aluminum alloy.

Further, the thickness of the first work function layer is in a range of approximately 30 Å to 130 Å; and the thickness of the second work function layer is in a range of 0 Å to approximately 20 Å.

Another aspect of the present disclosure provides a method for forming the semiconductor structure described above.

Another aspect of the present disclosure provides a semiconductor structure. The semiconductor structure includes a substrate; a fin structure, disposed on the substrate. The fin structure includes a channel region, a source region, and a drain region. The channel region is located between the source region and the drain region. The channel region includes a third nanowire and a fourth nanowire above the third nanowire. A third opening is formed between the third nanowire and the substrate, and between the source region and the drain region, and a fourth opening is formed between the fourth nanowire and the third nanowire, and between the source region and the drain region. The semiconductor structure further includes a third gate structure, formed in the third opening and across and surrounding the third nanowire; and a fourth gate structure, formed in the fourth opening and across and surrounding the fourth nanowire. The third gate structure includes a third work function layer, the fourth gate structure includes a fourth work function layer, and the fourth work function layer is different from the third work function layer in work-function type, thickness, or a combination thereof.

Optionally, the type of the third work function layer is the same as the type of the fourth work function layer; and the thickness of the third work function layer is higher than the thickness of the fourth work function layer.

Further, when the semiconductor structure is N-type, the third work function layer and the fourth work function layer are made of an N-type work-function material; when the semiconductor structure is P-type, the third work function layer and the fourth work function layer are made of a P-type work-function material; the thickness of the third work function layer is in a range of approximately 25 Å to 120 Å; and the thickness of the fourth work function layer is in a range of 0 Å to approximately 100 Å. The P-type work-function material includes tantalum nitride ($TaN_x$), aluminum nitride ($AlN_x$), or a combination thereof, and the N-type work-function material includes titanium aluminum alloy.

Optionally, the type of the third work function layer is opposite to the type of the fourth work function layer; when the semiconductor structure is N-type, the third work function layer is made of an N-type work-function material, and the fourth work function layer is made of a P-type work-function material; when the semiconductor structure is P-type, the third work function layer is made of the P-type work-function material, and the fourth work function layer is made of the N-type work-function material; the thickness of the third work function layer is in a range of approximately 30 Å to 130 Å; and the thickness of the fourth work function layer is in a range of 0 Å to approximately 20 Å. The P-type work-function material includes tantalum nitride ($TaN_x$), aluminum nitride ($AlN_x$), or a combination thereof, and the N-type work-function material includes titanium aluminum alloy.

Optionally, the third gate structure further includes a preset work function layer, wherein the third work function layer is formed on the preset work function layer; when the semiconductor structure is N-type, the preset work function layer is made of an N-type work-function material; and when the semiconductor structure is N-type, the preset work function layer is made of a P-type work-function material. The P-type work-function material includes tantalum nitride ($TaN_x$), aluminum nitride ($AlN_x$), or a combination thereof, and the N-type work-function material includes titanium aluminum alloy.

Optionally, the third nanowire contains third threshold-voltage adjustment ions; and the fourth nanowire contains fourth threshold-voltage adjustment ions.

Optionally, the type of the third threshold-voltage adjustment ions is opposite to the type of the fourth threshold-voltage adjustment ions; when the semiconductor structure is N-type, the third threshold-voltage adjustment ions are N-type, and the fourth threshold-voltage adjustment ions are P-type; the concentration of the third threshold-voltage adjustment ions is in a range of approximately 5.0E17 to 7.0E19 atoms per cubic centimeter (atom/$cm^3$); and the concentration of the fourth threshold-voltage adjustment ions is in a range of 0 to approximately 4.0E19 atom/$cm^3$.

Optionally, the type of the third threshold-voltage adjustment ions is same as the type of the fourth threshold-voltage adjustment ions; when the semiconductor structure is N-type, the third threshold-voltage adjustment ions and the fourth threshold-voltage adjustment ions are N-type; when the semiconductor structure is P-type, the third threshold-voltage adjustment ions and the fourth threshold-voltage adjustment ions are P-type; the concentration of the third threshold-voltage adjustment ions is higher than the concentration of the fourth threshold-voltage adjustment ions. The concentration of the third threshold-voltage adjustment ions is in a range of approximately 1.5E18 to 1.0E20 atom/$cm^3$; and the concentration of the fourth threshold-voltage adjustment ions is in a range of 0 to approximately 8.0E19 atom/$cm^3$.

Another aspect of the present disclosure provides a method for forming the semiconductor structure described above.

Compared to the existing technology, the technical solution of the present disclosure at least includes the following exemplary advantages.

According to the disclosed semiconductor structure, the first nanowire contains first threshold-voltage adjustment ions, and the second nanowire contains second threshold-voltage adjustment ions. The first threshold-voltage adjustment ions may significantly increase the amount of electrons (e.g., the current) flowing through the first nanowire, such that the circuit current controlled by the first gate structure may be significantly increased. The second threshold-voltage adjustment ions may slightly increase the amount of electrons (e.g., the current) flowing through the second nanowire, such that the circuit current controlled by the second gate structure may be slightly increased. As such, the circuit current controlled by the second gate structure and the circuit current controlled by the second gate structure may become relatively balanced, thereby avoiding reduction in reliability of the semiconductor structure due to a large difference between the circuit current controlled by the first gate structure and the circuit current controlled by the second gate structure. Therefore, the performance of the semiconductor structure may be improved.

Further, the first gate structure includes a first work function layer, the second gate structure includes a second work function layer, different from the first work function layer. The first work function layer may be able to significantly reduce the turn-on voltage of the first gate structure, and the second work function layer may slightly reduce the turn-on voltage of the second gate structure. Therefore, under a same voltage, the circuit current controlled by the first gate structure may be large as compared to the circuit current controlled by the second gate structure. As such, balance between the circuit current controlled by the first gate structure and the circuit current controlled by the second gate structure can be improved.

According to the disclosed semiconductor structure, the fourth work function layer of a fourth gate structure is different from the third work function layer of a third gate structure. The third work function layer may be able to significantly reduce the turn-on voltage of the third gate structure, and the fourth work function layer may slightly reduce the turn-on voltage of the second gate structure. Therefore, under a same voltage, the circuit current controlled by the third gate structure may be large as compared to the circuit current controlled by the fourth gate structure. As such, the circuit current controlled by the third gate structure and the circuit current controlled by the fourth gate structure may become relatively balanced, thereby avoiding reduction in reliability of the semiconductor structure due to a large difference between the circuit current controlled by the third gate structure and the circuit current controlled by the fourth gate structure. Therefore, the performance of the semiconductor structure may be improved.

Further, the third nanowire contains third threshold-voltage adjustment ions, and the fourth nanowire contains fourth threshold-voltage adjustment ions. The type of the third threshold-voltage adjustment ions is opposite to the type of the fourth threshold-voltage adjustment ions. The third threshold-voltage adjustment ions may be able to significantly increase the amount of electrons (e.g., the current) flowing through the third nanowire, such that the circuit current controlled by the third gate structure may be significantly increased. The fourth threshold-voltage adjustment ions may slightly increase the amount of electrons (e.g., the current) flowing through the fourth nanowire, such that the circuit current controlled by the fourth gate structure may be slightly increased. As such, the circuit current controlled by the third gate structure and the circuit current controlled by the fourth gate structure may become relatively balanced.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the present disclosure, which are illustrated in the accompanying drawings. Wherever possible, the same reference numbers will be used throughout the drawings to refer to the same or like parts.

According to the existing technology, the performance of Fin FET with a gate-all-around (GAA) structure may still need to be improved. In the following, further analysis and description will be provided in combination with an example.

Figure 1:
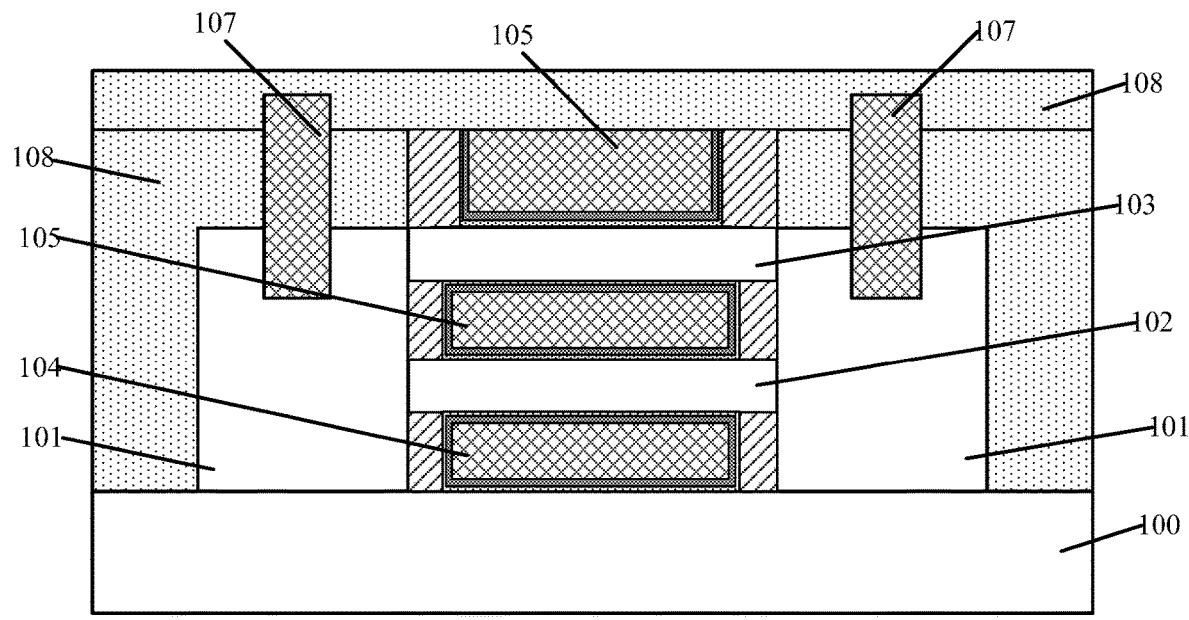
FIG. 1 illustrates a schematic cross-sectional view of a semiconductor structure.

FIG. 1 illustrates a schematic cross-sectional view of a semiconductor structure. Referring to FIG. 1, the semiconductor structure includes a substrate 100, and a fin structure disposed on the substrate 100. The fin structure includes two source-drain regions 101 and a channel region. The channel region is located between the two source-drain regions 101. The channel region includes a first nanowire 102, and a second nanowire 103 located above the first nanowire 102. A first opening (not shown) is disposed between the first nanowire 102 and the substrate 100, and a second opening (not shown) is disposed between the first nanowire 102 and the second nanowire 103. The semiconductor structure further includes a first gate structure formed in the first opening. The first gate structure surrounds the first nanowire 102, and includes a first gate dielectric layer (not shown) disposed on the surface of the first nanowire 102, a first work function layer (not shown) disposed on the surface of the first gate dielectric layer, and a first gate electrode layer 104 disposed on the surface of the first work function layer. The semiconductor structure further includes a second gate structure formed in the second opening and on the second nanowire 103. The second gate structure surrounds the second nanowire 103, and includes a second gate dielectric layer (not shown) disposed on the surface of the second nanowire 103, a second work function layer (not shown) disposed on the surface of the second gate dielectric layer, and a second gate electrode layer 105 disposed on the surface of the work function layer. The semiconductor structure further includes an isolation layer 108 formed on the substrate 100, and two plugs 107 formed in the isolation layer 108 and respectively located in the two source-drain regions 101.

In the semiconductor structure, the first gate structure and the second gate structure respectively control different devices and have different functions. The two plugs 107 are used to electrically connect the two source-drain regions 101 to the circuit of the semiconductor structure. In the direction perpendicular to the surface of the substrate, the distance between each plug 107 and the second gate structure is relatively short, and the distance between each plug 107 and the first gate structure is relatively long.

When the circuit of the semiconductor structure is on, the voltage is applied from the second gate structure to the first gate structure. Because the second gate structure is close to the plug 107, the current path between the plug 107 and the second gate structure is short, such that the resistance in the circuit is small and the current in the circuit is large. Because the first gate structure is far from the plug 107, the current path between the plug 107 and the first gate structure is long, such that the resistance in the circuit is large and the current in the circuit is small. Because the current of the device controlled by the first gate structure is small and the current of the device controlled by the second gate structure is large, the currents of the upper and lower devices of the semiconductor structure are uneven. As such, when the electrostatic reliability test is performed on the semiconductor structure, the electrostatic tolerance of the device controlled by the second gate structure is worse than the electrostatic tolerance of the device controlled by the first gate structure, which may cause the performance of the semiconductor structure to fail. In addition, because the current of the device controlled by the second gate structure is large, the device controlled by the second gate structure may easily run out of service life, causing the performance of the semiconductor structure to fail.

To solve the problems described above, the present disclosure provides a semiconductor structure and a method for fabricating the semiconductor structure. By doping different ions into the nanowires surrounded by the first gate structure and the second gate structure, and forming different work function layers in the first gate structure and the second gate structure, the circuit current controlled by the first gate structure is increased and the circuit current controlled by the second gate structure is reduced. As such, the circuit current controlled by the first gate structure and the circuit current controlled by the second gate structure may be relatively balanced, and thus the performance of the semiconductor structure may be improved.

To make the aforementioned objectives, features, and beneficial effects of the present disclosure more comprehensible, specific embodiments of the present disclosure are described in detail with reference to the accompanying drawings.

Figure 22:
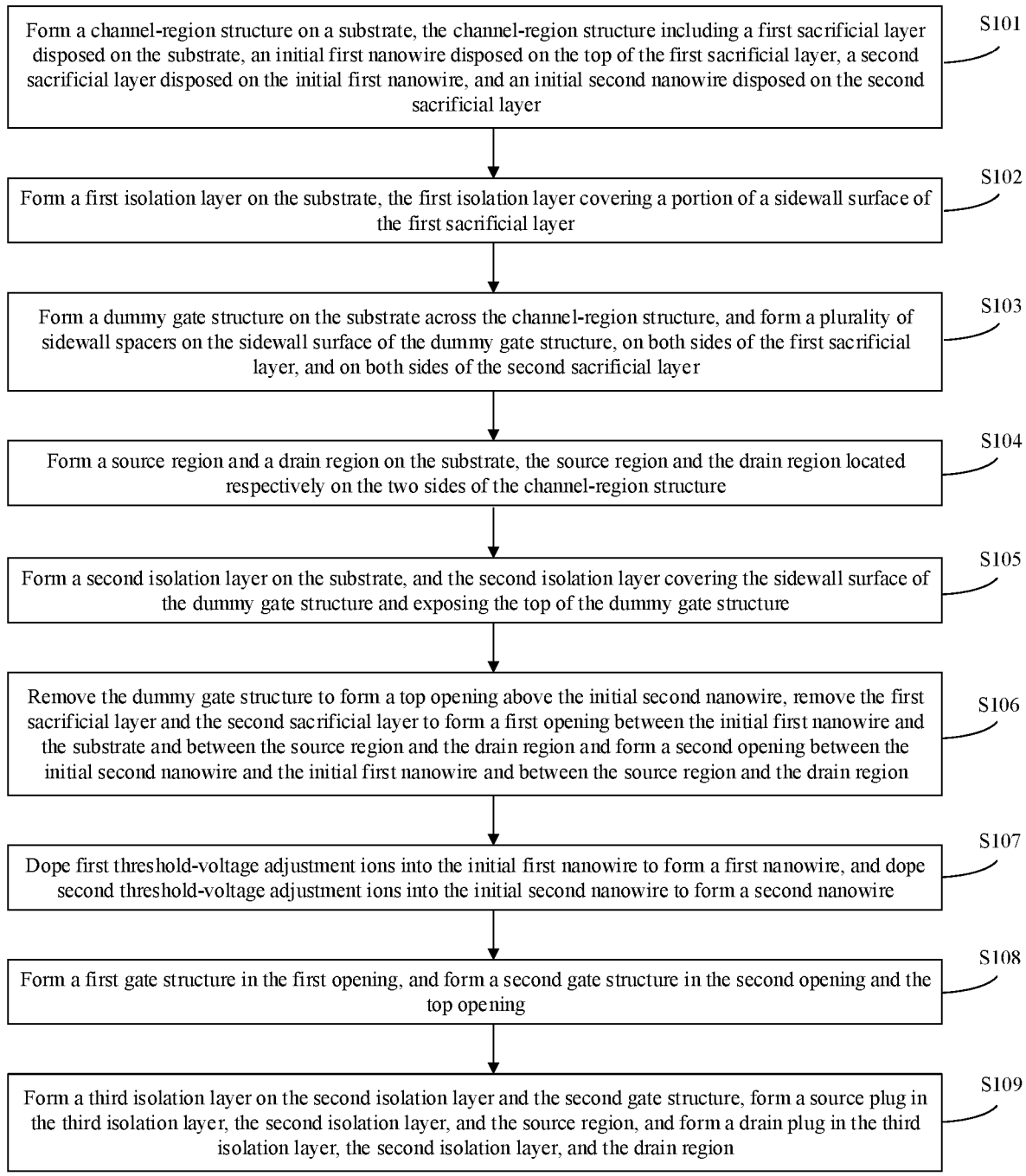
FIG. 22 illustrates a flowchart of an exemplary method for forming a semiconductor structure according to some embodiments of the present disclosure.

The present disclosure provides a method for forming a semiconductor structure. FIG. 22 illustrates a flowchart of an exemplary method for forming a semiconductor structure according to some embodiments of the present disclosure. FIGS. 2-10 illustrate schematic cross-sectional views of semiconductor structures at certain stages of the exemplary method.

According to the disclosed method, a fin structure may be formed on a substrate firstly. The fin structure may include a channel region, a source region, and a drain region. The channel region may be located between the source region and the drain region. The channel region may include a first nanowire, and a second nanowire above the first nanowire. The first nanowire may contain first threshold-voltage adjustment ions, and the second nanowire may contain second threshold-voltage adjustment ions. A first opening is formed between the first nanowire and the substrate, and between the source region and the drain region. A second opening is formed between the second nanowire and the first nanowire, and between the source region and the drain region. In the following, a detailed description of the formation process of the fin structure will be provided with reference to FIGS. 2-7.

Figure 2:
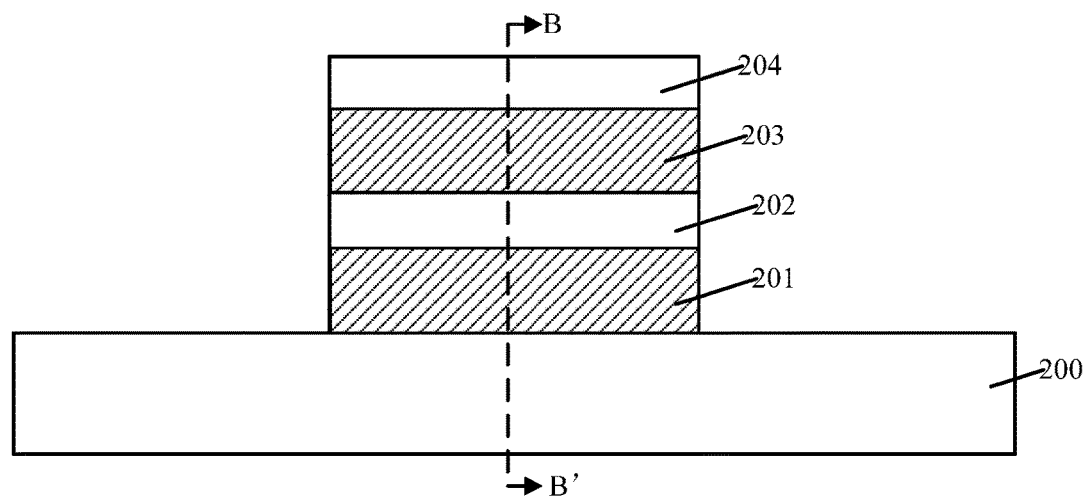
FIGS. 2-10 illustrate schematic cross-sectional views of semiconductor structures at certain stages of an exemplary method for forming a semiconductor structure according to some embodiments of the present disclosure.
Figure 3:
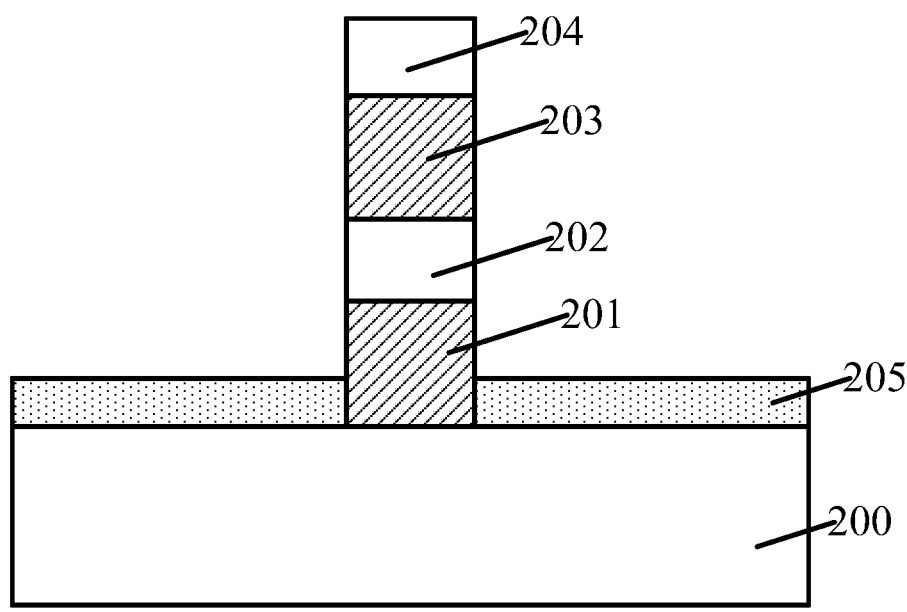

Referring to FIG. 22, in S101, a channel-region structure may be formed on a substrate. FIGS. 2-3 illustrate schematic cross-sectional views of a semiconductor structure according to some embodiments of the present disclosure. Specifically, FIG. 3 illustrates the cross-sectional view of the semiconductor structure shown in FIG. 2 along an AA' direction.

Referring to FIGS. 2-3, a substrate 200 may be provided, and a channel-region structure may be formed on the substrate 200. The channel-region structure may include a stack structure of multiple fin units. Each fin unit may include a sacrificial layer and an initial nanowire disposed on top of the sacrificial layer, and the sacrificial layer and the initial nanowire may be made of different materials.

In one embodiment, the channel-region structure may include a first fin unit, and a second fin unit located above the first fin unit. The first fin unit may include a first sacrificial layer 201 disposed on the substrate 200 and an initial first nanowire 202 disposed on the top of the first sacrificial layer 201. The second fin unit may include a second sacrificial layer 203 disposed on the initial first nanowire 202 and an initial second nanowire 204 disposed on the top of the second sacrificial layer 203.

In one embodiment, the substrate 200 may be made of silicon (Si). In other embodiments, the substrate may be made of silicon-germanium (SiGe), germanium (Ge), silicon on insulator (SOI), or germanium on insulator (GOI), etc.

In one embodiment, forming the first fin unit and the second fin unit may include the following exemplary steps. A first sacrificial material layer (not shown) may be formed on the substrate 200, a first nanowire material layer (not shown) may be formed on the first sacrificial material layer, a second sacrificial material layer (not shown) may be formed on the first nanowire material layer, a second nanowire material layer (not shown) may be formed on the second sacrificial material layer, and a first mask layer (not shown) may be formed on the second nanowire material layer. Then, the nanowire material layers (including the first nanowire material layer and the second nanowire material layer) and the sacrificial material layers (including the first sacrificial material layer and the second sacrificial material layer) may be etched using the first mask layer as an etch mask until exposing the substrate 200, such that the first sacrificial material layer may become the first sacrificial layer 201, the first nanowire material layer may become the initial first nanowire 202, the second sacrificial material layer may become the second sacrificial layer 203, and the second nanowire material layer may become the initial second nanowire 204. As such, the channel-region structure may be formed.

The sacrificial layer and the nanowire may be made of different materials. For example, the first sacrificial layer 201 and the second sacrificial layer 203 may be made of a material including single-crystalline silicon (Si) or single-crystalline silicon-germanium (SiGe), and the initial first nanowire 202 and the initial second nanowire 204 may be formed by a material including single-crystalline silicon (Si), or single-crystalline silicon-germanium (SiGe). In one embodiment, the first sacrificial layer 201 and the second sacrificial layer 203 may be made of silicon-germanium (SiGe). The initial first nanowire 202 and the initial second nanowire 204 may be made of single-crystalline silicon (Si).

The sacrificial layer and the nanowire may be made of different materials. Therefore, the etching rate of the sacrificial layer may be different from the etching rate of the nanowire during the etching process. As such, when the sacrificial layer is subsequently removed, damage to the nanowire may be limited.

Referring to FIG. 22, in S102, after the channel-region structure is formed, a first isolation layer may be formed on the substrate, and the first isolation layer may cover a portion of the sidewall surface of the first sacrificial layer. The semiconductor structure shown in FIG. 3 includes a first isolation layer according to some embodiments of the present disclosure.

Referring to FIG. 3, after the channel-region structure is formed, a first isolation layer 205 may be formed on the substrate 200. The first isolation layer 205 may cover a portion of the sidewall surface of the first sacrificial layer 201.

The first isolation layer 205 may be used to electrically isolate a subsequently formed gate structure and the substrate 200, and prevent the performance of the semiconductor structure from being damaged.

Figure 4:
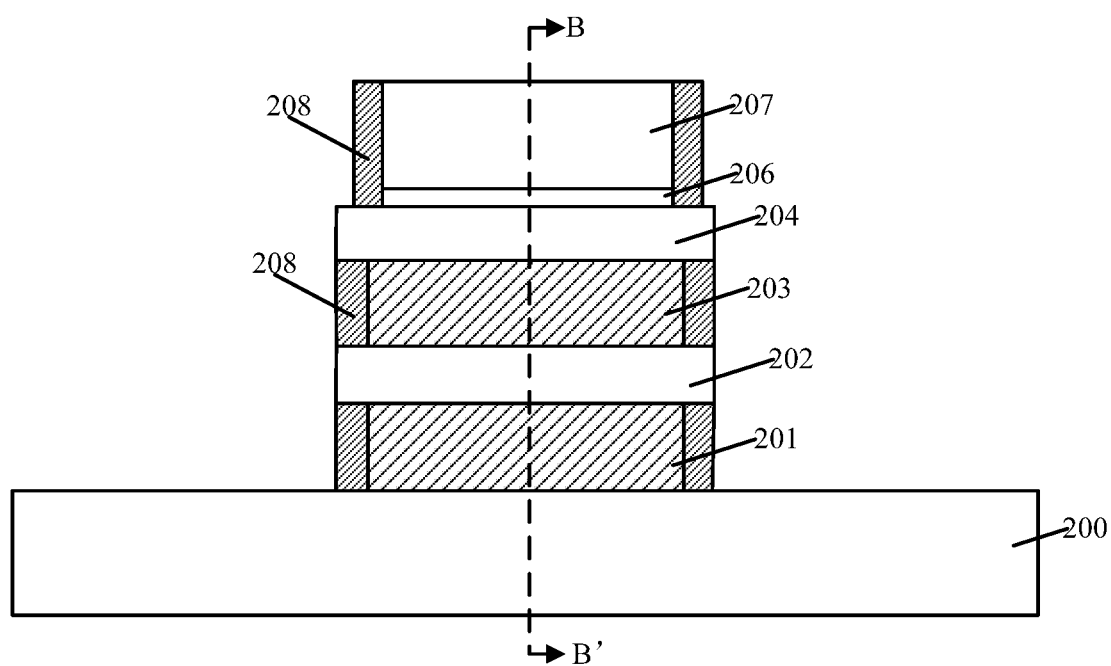
Figure 5:
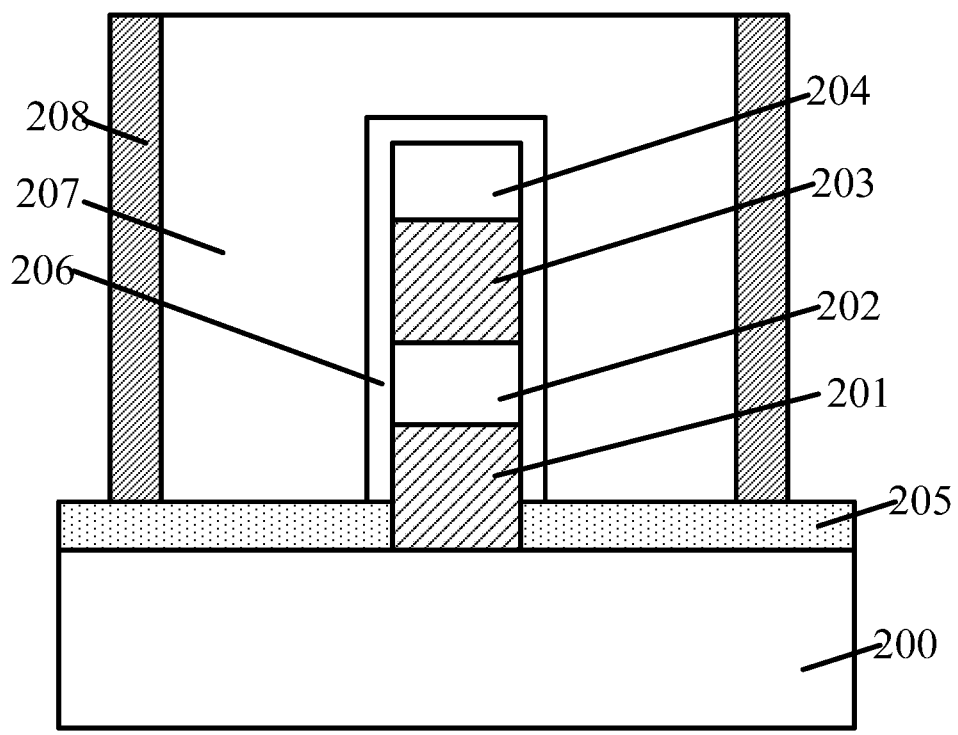

Returning to FIG. 22, in S103, a dummy gate structure may be formed on the substrate across the channel-region structure, and a plurality of sidewall spacers may be formed on the sidewall surface of the dummy gate structure, on both sides of the first sacrificial layer, and also on both sides of the second sacrificial layer. FIGS. 4-5 illustrate schematic cross-sectional views of a semiconductor structure according to some embodiments of the present disclosure. Specifically, FIG. 5 illustrates the cross-sectional view of the semiconductor structure shown in FIG. 4 along a BB' direction.

Referring to FIGS. 4-5, a dummy gate structure may be formed on the substrate 200 across the channel-region structure. A plurality of sidewall spacers 208 may be formed on the sidewall surface of the dummy gate structure, on both sides of the first sacrificial layer 201, and also on both sides of the second sacrificial layer 203.

The dummy gate structure may include a dummy dielectric layer 206 and a dummy gate electrode layer 207 formed on the dummy dielectric layer 206.

In one embodiment, forming the dummy gate structure may include the following exemplary steps. A dummy gate dielectric film (not shown) covering the channel-region structure may be formed over the substrate 200, a dummy gate film (not shown) may be formed on the dummy gate dielectric film, and then a second mask layer (not shown) may be formed on the dummy gate film. The second mask layer may define the position and dimension of the dummy gate structure. Further, the dummy dielectric film and the dummy gate film may be etched using the second mask layer as an etch mask until exposing the channel-region structure. As such, the dummy gate structure may be formed on the channel-region structure.

In one embodiment, the dummy gate dielectric film and the dummy gate film may be etched by a dry etching process. In one embodiment, the dummy gate dielectric layer 206 may be made of silicon oxide ($SiO_x$). The dummy gate dielectric film may be formed by a chemical vapor deposition (CVD) process, an atomic layer deposition (ALD) process, or a thermal oxidation process.

In one embodiment, the dummy gate electrode layer 207 may be made of silicon (Si), and the dummy gate film may be formed by a PVD process.

In one embodiment, the dummy gate structure may further include a protective layer (not shown) formed on the dummy gate electrode layer 207. The protective layer may be used to protect the dummy gate electrode layer 207 during the formation of the source region and the drain region. In addition, the protective layer may also serve as a stop layer for subsequently planarizing an initial second isolation layer.

The protective layer may be made of silicon oxide ($SiO_x$) or silicon nitride ($SiN_x$). In one embodiment, the protective layer may be made of silicon nitride ($SiN_x$).

In one embodiment, forming the plurality of sidewall spacers 208 may include the following exemplary steps. After forming the dummy gate structure, a portion of the first sacrificial layer 201 and the second sacrificial layer 203 may be removed, such that the first sacrificial layer 201 may recess inwardly with respect to the sidewall surface of the initial first nanowire 202, and the second sacrificial layer 203 may also recess inwardly with respect to the sidewall surface of the initial second nanowire 204. After removing portion of the first sacrificial layer 201 and the second sacrificial layer 203, a sidewall spacer material film (not shown) may be formed on the sidewall surface of the dummy gate structure and the sidewall surface of the channel-region structure. The sidewall spacer material film may be etched back to expose the sidewall surface of the initial first nanowire 202 and the sidewall surface of the initial second nanowire 204. Thus, the plurality of sidewall spacers 208 may be formed on the sidewall surface of the dummy gate structure, on both sides of the first sacrificial layer 201, and also on both sides of the second sacrificial layer 203.

According to the disclosed method, a portion of the first sacrificial layer 201 and the second sacrificial layer 203 may be removed to make the first sacrificial layer 201 recess inwardly with respect to the sidewall of the initial first nanowire 202 and the second sacrificial layer 203 recess inwardly with respect to the sidewall of the initial second nanowire 204, thereby providing space for forming the plurality of sidewall spacers 208 on both sides of the first sacrificial layer 201 and also on both sides of the second sacrificial layer 203. In one embodiment, the first sacrificial layer 201 and the second sacrificial layer 203 may be removed by a wet etching process.

The plurality of sidewall spacers 208 may be made of a material including silicon oxide ($SiO_x$), silicon nitride ($SiN_x$), and silicon oxynitride (SiON). In one embodiment, the plurality of sidewall spacers 208 may be made of silicon nitride ($SiN_x$). In one embodiment, the sidewall spacer material film may be formed by a CVD process or an ALD process.

Figure 6:
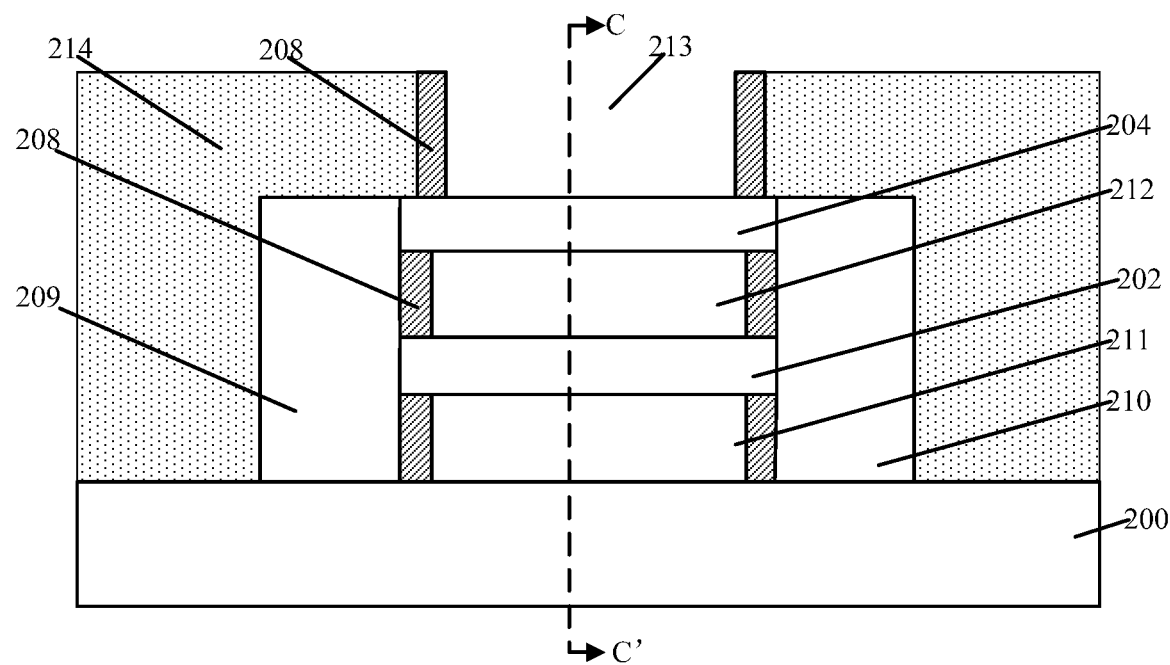
Figure 7:
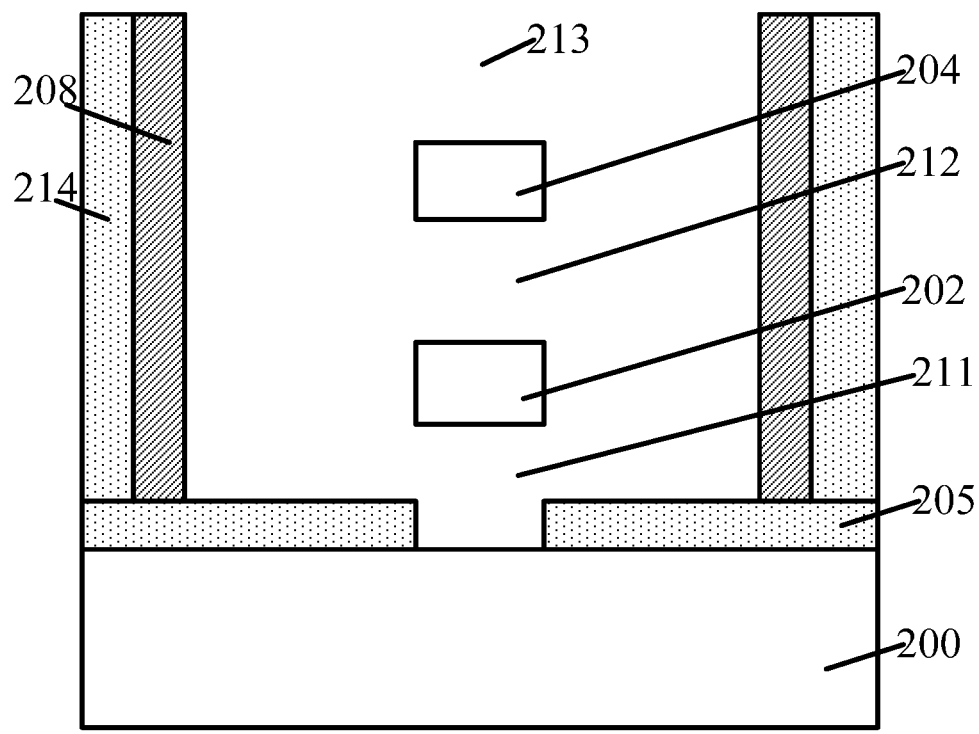

Returning to FIG. 22, in S104, a source region and a drain region may be formed on the substrate respectively on the two sides of the channel-region structure. FIGS. 6-7 illustrate schematic cross-sectional views of a semiconductor structure according to some embodiments of the present disclosure. Specifically, FIG. 7 illustrates a cross-sectional view of the semiconductor structure shown in FIG. 6 along a CC' direction.

Referring to FIG. 6 and FIG. 7, a source region 209 and a drain region 210 may be formed on the substrate 200. The source region 209 and the drain region 210 may be respectively located on the two sides of the channel-region structure. After the source region 209 and the drain region 210 are formed, the dummy gate structure may be removed in a subsequent process, and after the dummy gate structure is removed, the first sacrificial layer 201 and the second sacrificial layer 203 may be removed.

Forming the source region 209 and the drain region 210 may include the following exemplary steps. A trench (not shown) may be formed in the dummy gate structure on each side of the fin structure. In a lateral direction, the trench may be separated from the fin structure by a sidewall spacer 208. Therefore, corresponding to the two sides of the fin structure, two trenches may be formed. After forming the two trenches, the source region 209 and the drain region 210 may be formed in the two trenches. In one embodiment, the source region 209 and the drain region 210 may be formed by an epitaxial growth process.

The source region 209 and the drain region 210 may contain source-drain doping ions. In one embodiment, the source-drain doping ions may be doped into the source region 209 and the drain region 210 by an in-situ doping process. In other embodiments, the source region 209 and the drain region 210 may be formed by an ion implantation process.

When the semiconductor device is a P-type device, the source region 209 and the drain region 210 may be formed by a material including silicon (Si), germanium (Ge), or silicon-germanium (SiGe). The source-drain doping ions may be P-type ions, including boron ions, $BF^{2-}$ ions, indium ions, or a combination thereof.

When the semiconductor device is an N-type device, the source region 209 and the drain region 210 may be made of a material including silicon (Si), gallium arsenide (GaAs), or indium gallium arsenide (InGaAs). The source-drain doping ions may be N-type ions, including phosphorus ions, arsenic ions, or a combination thereof.

Returning to FIG. 22, in S105, after the source region and the drain region are formed, a second isolation layer may be formed on the substrate, and the second isolation layer may cover the sidewall surface of the dummy gate structure and expose the top of the dummy gate structure. The semiconductor structure shown in FIGS. 6-7 includes a second isolation layer formed on the substrate and the fin structure according to some embodiments of the present disclosure.

Referring to FIGS. 6-7, after the source region 209 and the drain region 210 are formed, a second isolation layer 214 may be formed over the substrate and the fin structure. The second isolation layer 214 may cover the sidewall surface of the dummy gate structure and expose the top of the dummy gate structure. The second isolation layer 214 may be used to electrically isolate adjacent semiconductor devices.

Forming the second isolation layer 214 may include the following exemplary steps. An initial second isolation layer (not shown) may be formed over the source region 209, the drain region 210, the dummy gate structure, and the plurality of sidewall spacers 208. The initial second isolation layer may cover the top and sidewall surfaces of the dummy gate structure. Then, the initial second isolation layer may be planarized until exposing the surface of the dummy gate protective layer formed on the dummy gate structure. As such, the second isolation layer 214 may be formed. In one embodiment, the top surface of the isolation layer 214 is leveled with the top surface of the dummy gate structure.

In one embodiment, the second isolation layer 214 may be made of silicon oxide ($SiO_x$). In one embodiment, the initial second isolation layer may be planarized by a chemical mechanical polishing (CMP) process.

Returning to FIG. 22, in S106, after the second isolation layer is formed, the dummy gate structure may be removed to form a top opening above the initial second nanowire, after the dummy gate structure is removed, the first sacrificial layer and the second sacrificial layer may be removed to form a first opening between the initial first nanowire and the substrate and between the source region and the drain region and also form a second opening between the initial second nanowire and the initial first nanowire and between the source region and the drain region. The semiconductor structure shown in FIGS. 6-7 includes a top opening, a first opening, a second opening according to some embodiments of the present disclosure.

Referring to FIGS. 6-7, after the second isolation layer 214 is formed, the dummy gate structure may be removed to form a top opening 213 above the initial second nanowire 204. Further, after the dummy gate structure is removed, the first sacrificial layer 201 and the second sacrificial layer 203 may be removed to form a first opening 211 and a second opening 212. The first opening 211 may be located between the initial first nanowire 202 and substrate 200 and between the source region 209 and the drain region 210, and the second opening 212 may be located between the initial second nanowire 204 and the initial first nanowire 202 and between the source region 209 and the drain region 210.

The initial first nanowire 202 may be used as a channel for a first gate structure that is subsequently formed in the first opening. The initial second nanowire 204 may be used as a channel for a second gate structure that is subsequently formed in the second opening.

Removing the dummy gate structure may include removing the dummy gate electrode layer 207 and, after removing the dummy gate electrode layer 207, removing the dummy gate dielectric layer 206. The dummy gate electrode layer 207 may be removed by a dry etching process, a wet etching process, or a combination thereof. The dummy gate dielectric layer 206 may be removed by a dry etching process, a wet etching process, or a combination thereof.

Further, after the dummy gate structure is removed, the first sacrificial layer 201 and the second sacrificial layer 203 may be exposed. The first sacrificial layer 201 and the second sacrificial layer 203 may be removed by a wet etching process.

Because the sacrificial layers (including, for example, the first sacrificial layer 201 and the second sacrificial layer 203) are made of a material different from the material of the nanowires (including, for example, the initial first nanowire 202 and the initial second nanowire 204), the etching solution used in the wet etching process may have an etching rate on the sacrificial layers different from an etching rate on the nanowires. The etching solution may be used to remove the first sacrificial layer 201 and the second sacrificial layer 203, and thus the etching rate of the initial first nanowire 202 and the initial second nanowire 204 is relatively small, such that damage to the initial first nanowire 202 and the initial second nanowire 204 during the wet etching process may be limited.

Figure 8:
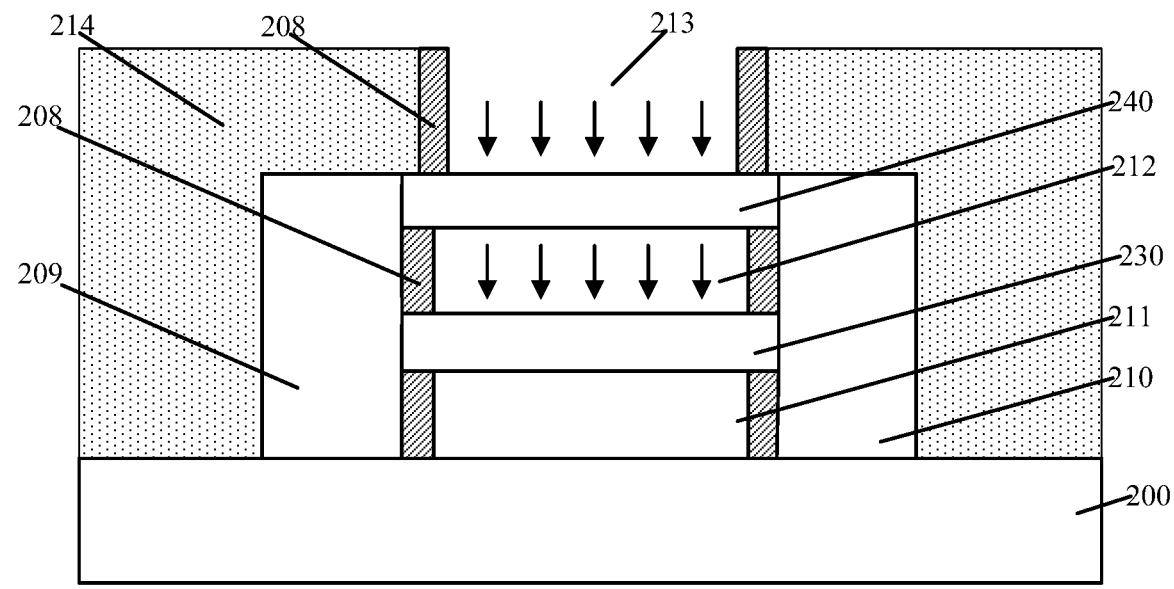

Returning to FIG. 22, in S107, first threshold-voltage adjustment ions may be doped into the initial first nanowire to form a first nanowire, and second threshold-voltage adjustment ions may be doped into the initial second nanowire to form a second nanowire. FIG. 8 illustrates a schematic cross-sectional view of a semiconductor structure according to some embodiments of the present disclosure.

Referring to FIG. 8, first threshold-voltage adjustment ions may be doped into the initial first nanowire 202 to form a first nanowire 230, and second threshold-voltage adjustment ions may be doped into the initial second nanowire 204 to form a second nanowire 240.

In one embodiment, the doping type of the first threshold-voltage adjustment ions may be opposite to the doping type of the second threshold-voltage adjustment ions. When the semiconductor structure is an N-type device, the first threshold-voltage adjustment ions may be N-type doping ions, and the second threshold-voltage adjustment ions may be P-type doping ions. When the semiconductor structure is a P-type device, the first threshold-voltage adjustment ions may be P-type doping ions, and the second threshold-voltage adjustment ions may be N-type doping ions. The P-type ions may include boron ions, $BF^{2-}$ ions, indium ions, or a combination thereof. The N-type ions may include phosphorus ions, arsenic ions, or a combination thereof.

When the doping type of the first threshold-voltage adjustment ions is the same as the doping type of the semiconductor structure, the first threshold-voltage adjustment ions may increase the amount of electrons flowing through the first nanowire, such that the circuit current controlled by the first gate structure may be increased. When the doping type of the second threshold-voltage adjustment ions is opposite to the doping type of the first threshold-voltage adjustment ions, the second threshold-voltage adjustment ions may decrease the amount of electrons flowing through the second nanowire, such that the circuit current controlled by the second gate structure may be reduced. As such, the circuit current controlled by the second gate structure and the circuit current controlled by the second gate structure may become relatively balanced, thereby avoiding reduction in reliability of the semiconductor structure due to a large difference between the circuit current controlled by the first gate structure and the circuit current controlled by the second gate structure. Therefore, the performance of the semiconductor structure may be improved.

In one embodiment, doping the first threshold-voltage adjustment ions into the initial first nanowire 202 may include an ion implantation process; and doping the second threshold-voltage adjustment ions into the initial second nanowire 204 may include an ion implantation process. In one embodiment, the first threshold-voltage adjustment ions may be implanted into the initial first nanowire 202 prior to the second threshold-voltage adjustment ions are implanted into the initial second nanowire 204. In other embodiments, the first threshold-voltage adjustment ions may be implanted into the initial first nanowire after the second threshold-voltage adjustment ions are implanted into the initial second nanowire.

Implanting the first threshold-voltage adjustment ions may include forming a third mask layer over the second nanowire 204, and implanting the first threshold-voltage adjustment ions into the initial first nanowire 202 using the third mask layer as a mask. As such, after the ion implantation process, the initial first nanowire 202 may become a first nanowire 230. In one embodiment, after performing the implantation process, the concentration of the first threshold-voltage adjustment ions in the first nanowire 230 may be in a range of approximately 5.0E17 to 7.0E19 atoms per cubic centimeter (atom/cm$^3$).

Implanting the second threshold-voltage adjustment ions may include forming a fourth mask layer over the first nanowire 230, and implanting the second threshold-voltage adjustment ions into the initial second nanowire 204 using the fourth mask layer as a mask. As such, after the ion implantation process, the initial second nanowire 204 may become a second nanowire 240. In one embodiment, after performing the implantation process, the concentration of the second threshold-voltage adjustment ions in the second nanowire 240 may be in a range of a to approximately 4.0E19 atoms per cubic centimeter (atom/cm$^3$).

In other embodiments, the first threshold-voltage adjustment ions and the second threshold-voltage adjustment ions may have the same doping type, and the first threshold-voltage adjustment ions and the second threshold-voltage adjustment ions may have different concentrations.

Figure 9:
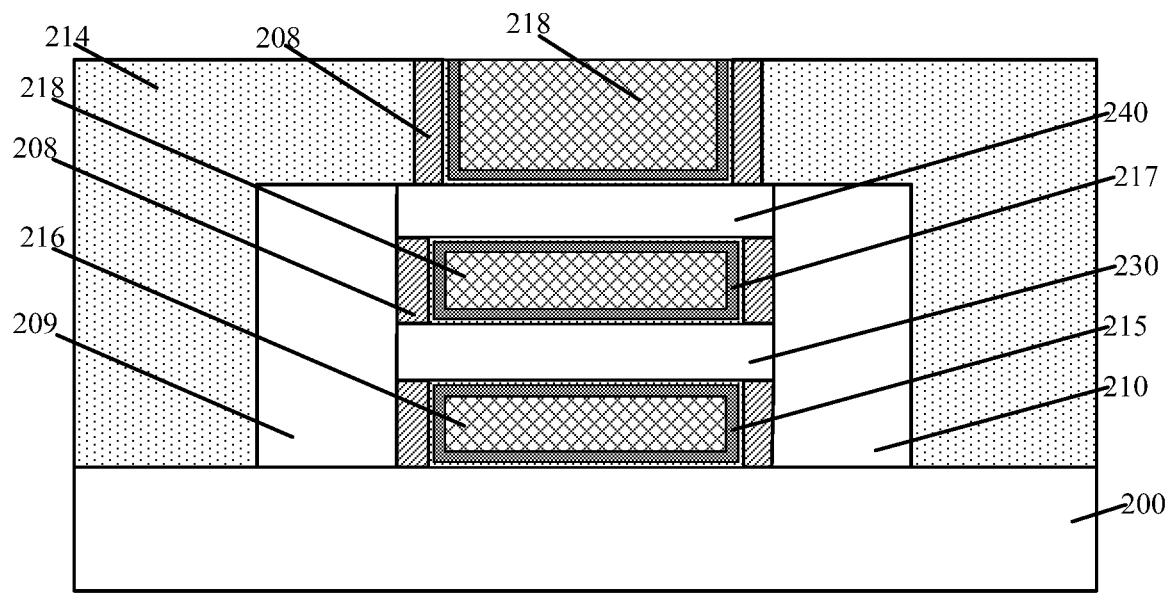

Referring to FIG. 22, in S108, after the first nanowire and the second nanowire are formed, a first gate structure may be formed in the first opening, and a second gate structure may be formed in the second opening and the top opening. FIG. 9 illustrates a schematic cross-sectional view of a semiconductor structure according to some embodiments of the present disclosure.

Referring to FIG. 9, after the first nanowire 230 and the second nanowire 240 are formed, a first gate structure may be formed in the first opening 211, and a second gate structure may be formed in the second opening 212 and the top opening 213.

The first gate structure may be formed across the first nanowire 230 and may surround the first nanowire 230. The second gate structure may be formed across the second nanowire 240 and may surround the second nanowire 240.

The first gate structure may include a first gate dielectric layer (not shown), a first work function layer 215 formed on the first gate dielectric layer, and a first gate electrode layer 216 formed on the first work function layer 215. The second gate structure may include a second gate dielectric layer (not shown), a second work function layer 217 formed on the second gate dielectric layer, and a second gate electrode layer 218 formed on the second work function layer 217. In one embodiment, the first gate structure and the second gate structure may be formed at the same time. In other embodiments, the first work function layer and the second work function layer may be formed at different times.

In one embodiment, forming the first gate structure and the second gate structure may include the following exemplary steps. A gate dielectric material layer (not shown) may be formed on the surface of the substrate 200, the inner-wall surface of the first opening 211, the inner-wall surface of the second opening 212, and the inner-wall surface of the top opening 213. Then, a work-function material layer (not shown) may be formed on the gate dielectric material layer, and a gate-electrode material layer (not shown) may be formed on the work-function material layer. The gate-electrode material layer may fill up the first opening 211, the second opening 212, and the top opening 213. Further, the gate-electrode material layer, the work-function material layer, and the gate dielectric material layer may be planarized until the second isolation layer 214 is exposed. As such, the first gate structure and the second gate structure may be formed.

The first gate dielectric layer and the second gate dielectric layer may be made of a same material. The first gate dielectric layer and the second gate dielectric layer may be made of a high-K material (a high-K dielectric material refers to a dielectric material having a relative dielectric constant greater than 3.9). The high-K material may include hafnium oxide ($HfO_x$), aluminum oxide ($AlO_x$), or a combination thereof.

The first gate dielectric layer and the second gate dielectric layer may be formed by a CVD process or an ALD process. In one embodiment, the first gate dielectric layer and the second gate dielectric layer may be formed by an ALD process. The ALD process may be able to ensure that the formed gate dielectric layers have low thickness, desired uniformity, and dense structure.

The first work function layer 215 and the second work function layer 217 may be made of a same material. When the semiconductor device is a P-type device, the first work function 215 and the second work function 217 may be made of a material including tantalum nitride ($TaN_x$), aluminum nitride ($AlN_x$), or a combination thereof. When the semiconductor device is an N-type device, the first work function 215 and the second work function 217 may be made of a material including titanium aluminum alloy.

The first work function 215 and the second work function 217 may be formed by a CVD process or an ALD process. In one embodiment, the first work function layer 215 and the second work function layer 217 may be formed by an ALD process. The ALD process may be able to ensure that the formed work function layers have low thickness, desired uniformity, and dense structure.

The first gate electrode layer 216 and the second gate electrode layer 218 may be made of a same material. In one embodiment, the first gate electrode layer 216 and the second gate electrode layer 218 may be made of a metal, and the metal may include tungsten (W). The first gate electrode layer 216 and the second gate electrode layer 218 may be formed by a PVD process.

Figure 10:
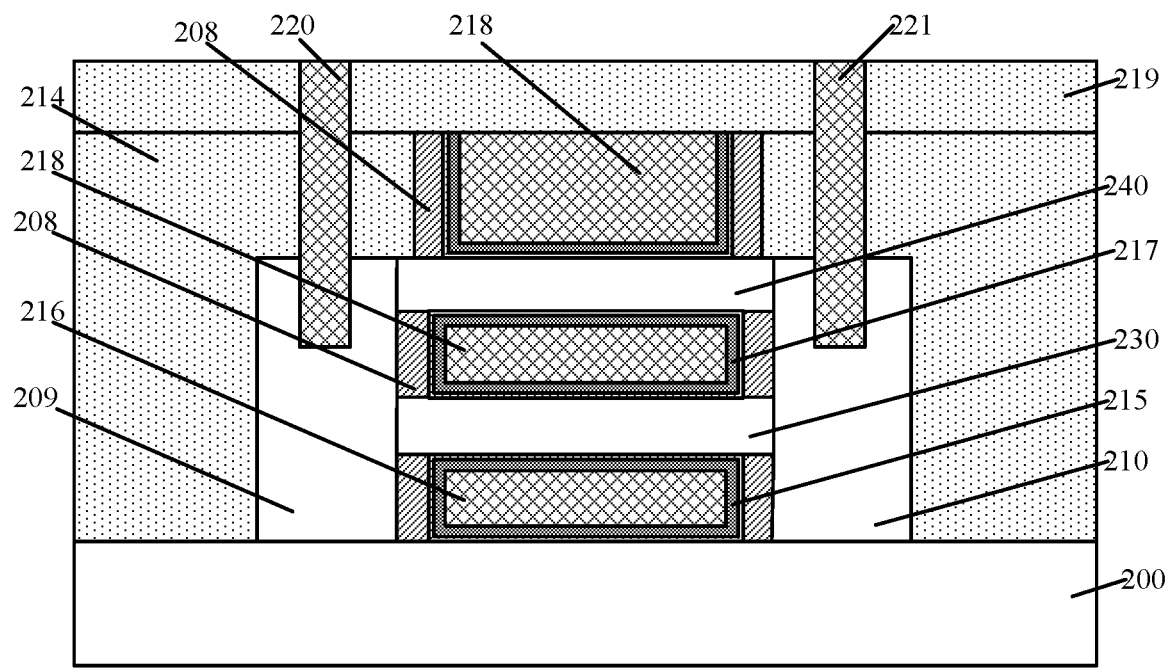

Returning to FIG. 22, in S109, after the first gate structure and the second gate structure are formed, a third isolation layer may be formed on the second isolation layer and on the surface of the second gate structure, a source plug may be formed in the third isolation layer, the second isolation layer, and the source region, and a drain plug may be formed in the third isolation layer, the second isolation layer, and the drain region. FIG. 10 illustrates a schematic cross-sectional view of a semiconductor structure according to some embodiments of the present disclosure.

Referring to FIG. 10, after the first gate structure and the second gate structure are formed, a third isolation layer 219 may be formed on the surface of the second isolation layer 214 and on the surface of the second gate structure. A source plug 220 may be formed in the third isolation layer 219, the second isolation layer 214, and the source region 209. A drain plug 221 may be formed in the third isolation layer 219, the second isolation layer 214, and the drain region 210.

The third isolation layer 219 may be used to protect the gate structures from being damaged during the formation of the source plug 220 and the drain plug 221. In the meantime, the third isolation layer 219 and the second isolation layer 214 may together provide structural support for the source plug 220 and the drain plug 221. In one embodiment, the third isolation layer 219 may be made of silicon oxide ($SiO_x$).

In one embodiment, the source plug 220 and the drain plug 221 may be formed at the same time. Forming the source plug 220 and the drain plug 221 may include the following exemplary steps. A fifth mask layer (not shown) exposing a portion of the third isolation layer 219 may be formed on the third isolation layer 219. The third isolation layer 219, the second isolation layer 214, the source region 209, and the drain region 210 may be etched using the fifth mask layer as an etch mask to form a trench in the third isolation layer 219, the second isolation layer 214, the source region 209, and the drain region 210. Further, a plug material layer (not shown) may be formed in the trench, and the plug material layer may then be planarized until exposing the third isolation layer 219 to form the source plug 220 and the drain plug 221.

In one embodiment, the third isolation layer 219, the second isolation layer 214, the source region 209, and the drain region 210 may be etched by a dry etching process. In one embodiment, the plug material layer may be planarized by a CMP process.

In the semiconductor structure formed by the method described above, the circuit current controlled by the first gate structure and the circuit current controlled by the second gate structure are relatively balanced, and thus the performance of the semiconductor structure may be improved.

Correspondingly, the present disclosure also provides a semiconductor structure formed by the method described above. FIG. 10 illustrates a schematic cross-sectional view of an exemplary semiconductor structure according to some embodiments of the present disclosure.

Referring to FIG. 10, the semiconductor structure may include a substrate 200 and a fin structure disposed on the substrate 200. The fin structure may include a channel region (for example, a channel-region structure is formed in the channel region), a source region 209, and a drain region 210. The channel-region structure may be disposed between the source region 209 and the drain region 210, and may include a first nanowire 230 and a second nanowire 240. The second nanowire 240 may be located above the first nanowire 230. The first nanowire 230 may contain first threshold-voltage adjustment ions, and the second nanowire 240 may contain second threshold-voltage adjustment ions. A first opening may be formed between the first nanowire 230 and the substrate 200, and between the source region 209 and the drain region 210. A second opening may be formed between the first nanowire 230 and the second nanowire 240, and between the source region 209 and the drain region 210. The semiconductor structure may further include a first gate structure located in the first opening and across the first nanowire 230, and the first gate structure may surround the first nanowire 230. The semiconductor structure may also include a second gate structure located in the second opening and across the second nanowire 240, and the second gate structure may surround the second nanowire 240.

In one embodiment, the doping type of the first threshold-voltage adjustment ions may be opposite to the doping type of the second threshold-voltage adjustment ions. In other embodiments, the first threshold-voltage adjustment ions and the second threshold-voltage adjustment ions may have a same doping type, and the first threshold-voltage adjustment ions and the second threshold-voltage adjustment ions may have different concentrations. For example, the concentration of the first threshold-voltage adjustment ions may be higher than the concentration of the second threshold-voltage adjustment ions.

Figure 11:
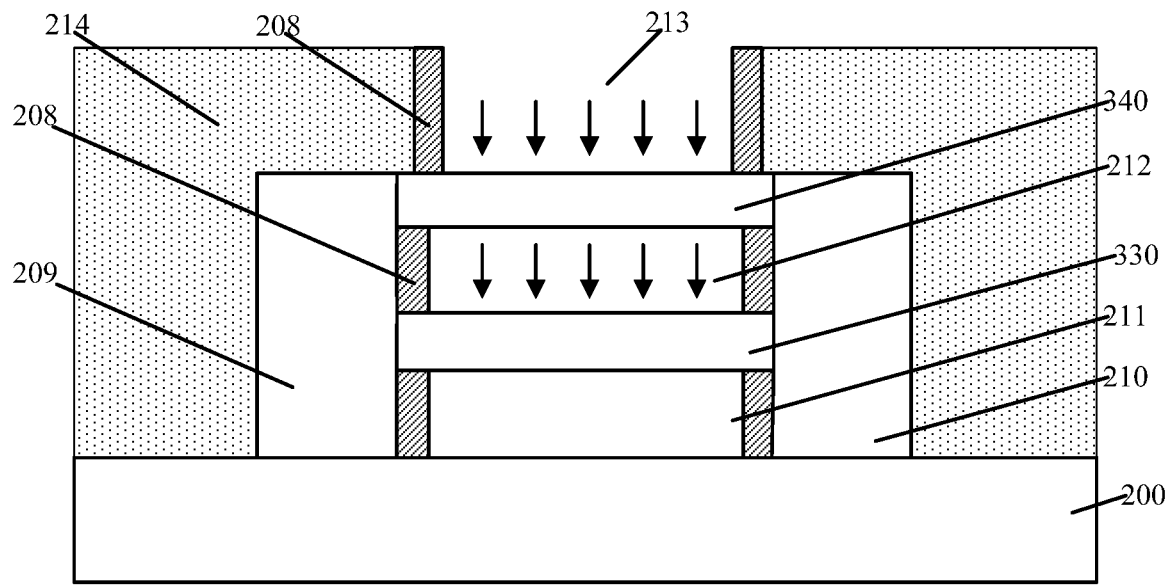
FIG. 11 illustrates a cross-sectional view of a semiconductor structure at a certain stage of another exemplary method for forming a semiconductor structure according to some embodiments of the present disclosure.

FIG. 11 illustrates a cross-sectional view of a semiconductor structure fabricating process according to another embodiment of the present disclosure. Specifically, the schematic cross-sectional view shown in FIG. 11 is developed from the semiconductor structure shown in FIG. 6. Referring to FIG. 11, the first threshold-voltage adjustment ions may be doped into the initial first nanowire 202 to form a first nanowire 330, and the second threshold-voltage regulation ions may be doped into the initial second nanowire 204 to form a second nanowire 340.

In one embodiment, the first threshold-voltage adjustment ions and the second threshold-voltage adjustment ions may have a same doping type. When the semiconductor structure is an N-type device, the first threshold-voltage adjustment ions and the second threshold-voltage adjustment ions may be N-type doping ions, and the N-type ions may include phosphorus ions, arsenic ions, or a combination thereof. When the semiconductor structure is a P-type device, the first threshold-voltage adjustment ions and the second threshold-voltage adjustment ions may be P-type doping ions, and the P-type ions may include boron ions, BF' ions, indium ions, or a combination thereof.

In one embodiment, the concentration of the first threshold-voltage adjustment ions may be higher than the concentration of the second threshold-voltage adjustment ions. Because the concentration of the first threshold-voltage adjustment ions is higher than the concentration of the second threshold-voltage adjustment ions, the first threshold-voltage adjustment ions may significantly increase the amount of electrons (e.g., the current) flowing through the first nanowire, such that the circuit current controlled by the first gate structure may be significantly increased. The second threshold-voltage adjustment ions may slightly increase the amount of electrons (e.g., the current) flowing through the second nanowire, such that the circuit current controlled by the second gate structure may be slightly increased. As such, the circuit current controlled by the second gate structure and the circuit current controlled by the second gate structure may become relatively balanced, thereby avoiding reduction in reliability of the semiconductor structure due to a large difference between the circuit current controlled by the first gate structure and the circuit current controlled by the second gate structure. Therefore, the performance of the semiconductor structure may be improved.

In one embodiment, the concentration of the first threshold-voltage adjustment ions may be in a range of approximately 1.5E18 to 1.0E20 atoms per cubic centimeter (atom/$cm^3$), and the concentration of the second threshold-voltage adjustment ions may be in a range of approximately 0 to 8.0E19 atoms per cubic centimeter (atom/$cm^3$).

In one embodiment, doping the first threshold-voltage adjustment ions into the initial first nanowire 202 may include an ion implantation process; and doping the second threshold-voltage adjustment ions into the initial second nanowire 204 may include an ion implantation process. In one embodiment, the first threshold-voltage adjustment ions may be implanted into the initial first nanowire 202 prior to the second threshold-voltage adjustment ions are implanted into the initial second nanowire 204. In other embodiments, the first threshold-voltage adjustment ions may be implanted into the initial first nanowire after the second threshold-voltage adjustment ions are implanted into the initial second nanowire.

Implanting the first threshold-voltage adjustment ions may include forming a sixth mask layer over the second nanowire 204, and implanting threshold-voltage adjustment ions into the initial first nanowire 202 using the sixth mask layer as a mask. As such, after the ion implantation process, the initial first nanowire 202 may become a first nanowire 330.

Implanting the second threshold-voltage adjustment ions may include forming a seventh mask layer over the first nanowire 330, and implanting threshold-voltage adjustment ions into the initial second nanowire 204 using the seventh mask layer as a mask. As such, after the ion implantation process, the initial second nanowire 204 may become a second nanowire 340.

Further, a first gate structure may be formed in the first opening 211, and a second gate structure may be formed in the second opening 212 and the top opening 213. After the first gate structure and the second gate structure are formed, a third isolation layer may be formed on the surfaces of the second isolation layer 214 and on the surface of the second gate structure; a source plug may be formed in the third isolation layer, the second isolation layer 214, and the source region 209; and a drain plug may be formed in the third isolation layer, the second isolation layer 214, and the drain region 209. For the details of exemplary fabrication steps, processes, and materials, reference may be made to the FIGS. 9-10 and the corresponding description in the embodiments provided above, which will not be repeated here.

Figure 12:
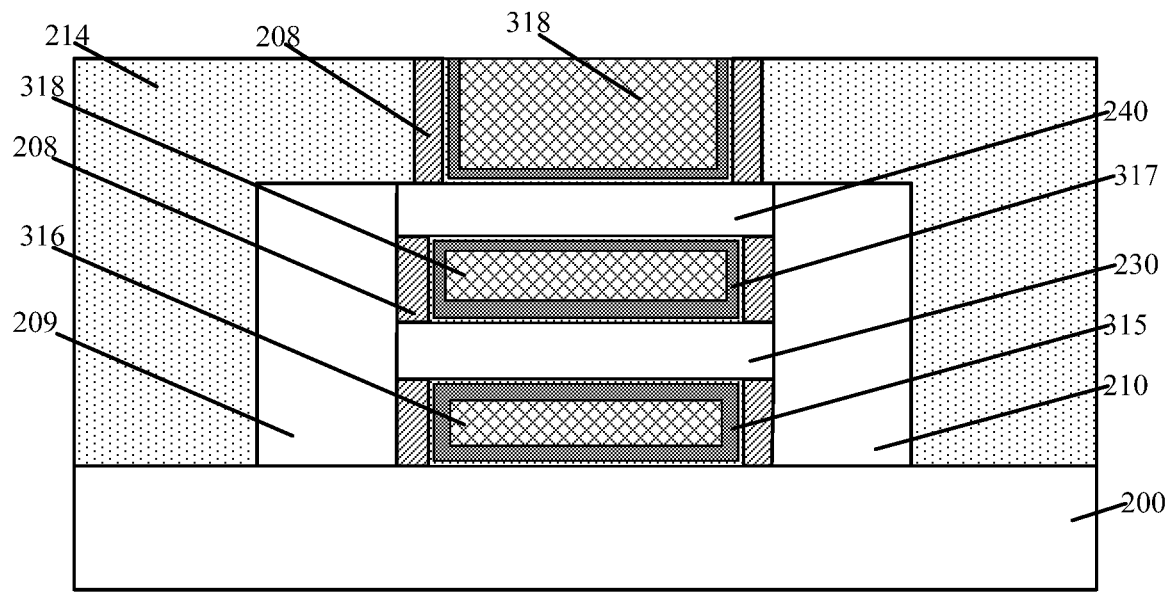
FIG. 12 illustrates a cross-sectional view of a semiconductor structure at a certain stage of another exemplary method for forming a semiconductor structure according to some embodiments of the present disclosure.

FIG. 12 illustrates a cross-sectional view of a semiconductor structure fabricating process according to another embodiment of the present disclosure. Specifically, the schematic cross-sectional view shown in FIG. 12 is developed from the semiconductor structure shown in FIG. 8. Referring to FIG. 12, after the first nanowire 230 and the second nanowire 240 are formed, a first gate structure may be formed in the first opening 211, and a second gate structure may be formed in the second opening 212 and the top opening 213.

The first gate structure may be formed across the first nanowire 230 and may surround the first nanowire 230. The second gate structure may be formed across the second nanowire 240 and may surround the second nanowire 240.

The first gate structure may include a first dielectric layer (not shown), a first work function layer 315 formed on the first dielectric layer, and a first gate electrode layer 316 formed on the first work function layer 315. The second gate structure may include a second dielectric layer (not shown), a second work function layer 317 formed on the second dielectric layer, and a second gate electrode layer 318 formed on the second work function layer 317.

In one embodiment, the second work function layer 317 may be different from the first work function layer 315. For example, the second work function layer 317 and the first work function layer 315 may be the same type, and the thickness of the first work function layer 315 may be higher than the thickness of the second work function layer 317.

Because the thickness of the first work function layer 315 is higher than the thickness of the second work function layer 317, the first work function layer 315 may be able to significantly reduce the turn-on voltage of the first gate structure, and the second work function layer 317 may slightly reduce the turn-on voltage of the second gate structure. Therefore, under a same voltage, the circuit current controlled by the first gate structure may be large as compared to the circuit current controlled by the second gate structure. Under the combined action of the first threshold-voltage adjustment ions and the second threshold-voltage adjustment ions, balance between the circuit current controlled by the first gate structure and the circuit current controlled by the second gate structure can be improved. As such, the performance of the semiconductor structure is improved.

When the semiconductor device is an N-type device, the first work function layer and the second work function layer may be made of an N-type work-function material, and the N-type work-function material may include titanium aluminum alloy. When the semiconductor device is a P-type device, the first work function layer and the second work function layer may be made of a P-type work-function material, and the P-type work-function material may include tantalum nitride ($TaN_x$), aluminum nitride ($AlN_x$), or a combination thereof.

In one embodiment, the first gate dielectric layer and the second gate dielectric layer may be formed at the same time, and the first gate electrode layer 316 and the second gate electrode layer 318 may be formed at the same time.

Forming the first gate structure and the second gate structure may include the following exemplary steps. A gate dielectric material layer (not shown) may be formed on the substrate 200, the inner-wall surface of the first opening 211, the inner-wall surface of the second opening 212, and the inner-wall surface of the top opening 213. Further, an initial work-function material layer (not shown) may be formed on the gate dielectric material layer, and an eighth mask layer (not shown) may be formed in the first opening 211 and over the first nanowire 230. Then, a portion of the initial work-function material layer located over the second nanowire 240 may be removed using the eighth mask layer as a mask to form the second work function layer 317 and the first work function layer 315. A gate-electrode material layer (not shown) may be formed on the second work function layer 317 and the first work function layer 315. The gate-electrode material layer may fill up the first opening 211, the second opening 212, and the top opening 213. Further, the gate-electrode material layer, the work-function material layer, and the gate dielectric material layer may be planarized until exposing the second isolation layer 214. As such, the first gate structure and the second gate structure may be formed.

In one embodiment, the thickness of the first work function layer 315 may be in a range of approximately 25 Å to 120 Å. The thickness of the second work function layer 317 may be in a range of 0 Å to approximately 100 Å.

In one embodiment, the initial work-function material layer may be removed by a wet etching process. The wet etching process is an isotropic etching process, which may ensure that the formed second work function layer 317 has a uniform thickness. The first work function layer 315 and the second work function layer 317 may be formed by a CVD process or an ALD process. In one embodiment, the first work function layer 315 and the second work function layer 317 may be formed by an ALD process. The ALD process may be able to ensure that the formed work function layers have low thickness, desired uniformity, and dense structure.

The first gate dielectric layer and the second gate dielectric layer may be made of a same material. For example, the first gate dielectric layer and the second gate dielectric layer may be made of a high-K material (a high-K dielectric materials refers to a dielectric material having a relative dielectric constant greater than 3.9). The high-K material may include hafnium oxide ($HfO_x$), aluminum oxide ($AlO_x$), or a combination thereof.

The first gate dielectric layer and the second gate dielectric layer may be formed by a CVD process or an ALD process. In one embodiment, the first gate dielectric layer and the second gate dielectric layer may be formed by an ALD process. The ALD process may be able to ensure that the formed gate dielectric layers have low thickness, desired uniformity, and dense structure.

The first gate electrode layer 316 and the second gate electrode layer 318 may be made of a same material. In one embodiment, the first gate electrode layer 316 and the second gate electrode layer 318 may be made of a metal, and the metal may include tungsten (W). The first gate electrode layer 316 and the second gate electrode layer 318 may be formed by a PVD process.

Further, a third isolation layer may be formed on the second isolation layer 214 and on the surface of the second gate structure. A source plug may be formed in the third isolation layer, the second isolation layer 214, and the source region 209. A drain plug may be formed in the third isolation layer, the second isolation layer 214, and the drain region 210. For the details of exemplary fabrication steps, processes, and materials, reference may be made to the FIG. 10 and the corresponding description in the embodiments provided above, which will not be repeated here.

Figure 13:
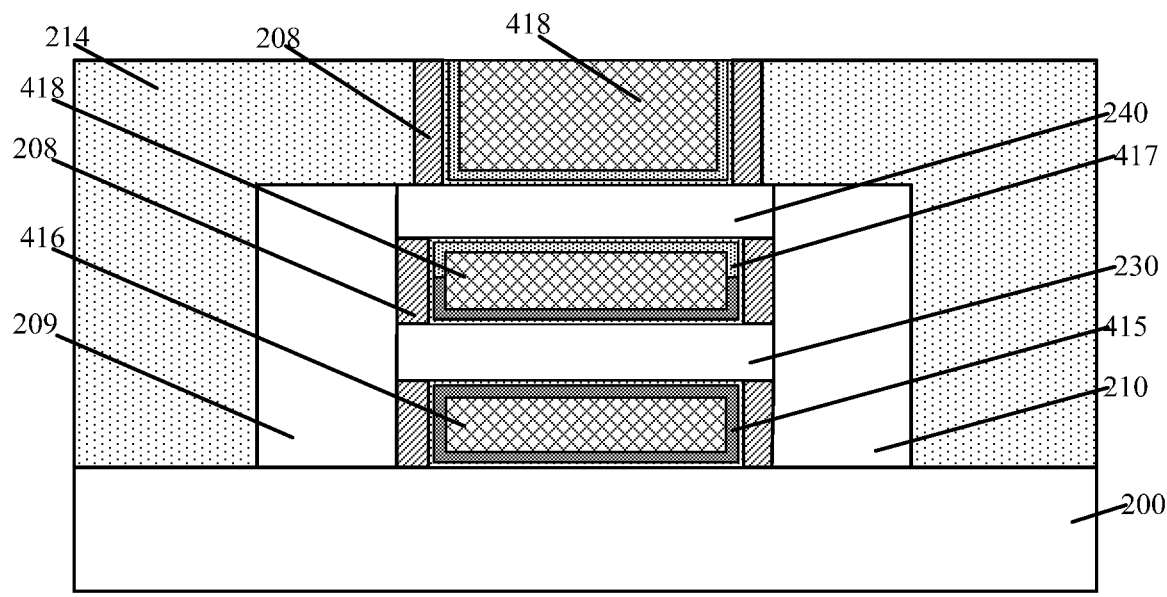
FIG. 13 illustrates a cross-sectional view of a semiconductor structure at a certain stage of another exemplary method for forming a semiconductor structure according to some embodiments of the present disclosure.

FIG. 13 illustrates a cross-sectional view of a semiconductor structure at a certain stage of another exemplary method for forming a semiconductor structure according to some embodiments of the present disclosure. Specifically, the schematic cross-sectional view shown in FIG. 13 is developed from the semiconductor structure shown in FIG. 8.

Referring to FIG. 13, after the first nanowire 230 and the second nanowire 240 are formed, a first gate structure may be formed in the first opening 211, and a second gate structure may be formed in the second opening 212 and the top opening 213.

The first gate structure may be formed across the first nanowire 230 and may surround the first nanowire 230. The second gate structure may be formed across the second nanowire 240 and may surround the second nanowire 240.

The first gate structure may include a first dielectric layer (not shown), a first work function layer 415 formed on the first dielectric layer, and a first gate electrode layer 416 formed on the first work function layer 415. The second gate structure may include a second dielectric layer (not shown), a second work function layer 417 formed on the second dielectric layer, and a second gate electrode layer 418 formed on the second work function layer 417.

In one embodiment, the second work function layer 417 may be different from the first work function layer 415. For example, the type of the second work function layer 417 may be opposite to the type of the first work function layer 415.

When the semiconductor structure is an N-type device, the first work function layer 415 may be made of an N-type work-function material, and the second work function layer 417 may be made of a P-type work-function material. When the semiconductor device is a P-type device, the first work function layer 415 may be made of the P-type work-function material, and the second work function layer 417 may be made of the N-type work-function material. The P-type work-function material may include tantalum nitride ($TaN_x$), aluminum nitride ($AlN_x$), or a combination thereof. The N-type work-function material may include titanium aluminum alloy.

Because the type of the second work function layer 417 is opposite to the type of the first work function layer 415, the first work function layer 415 may reduce the turn-on voltage of the first gate structure, and the second work function layer 417 may increase the turn-on voltage of the second gate structure. Therefore, under a same voltage, the circuit current controlled by the first gate structure may be large as compared to the circuit current controlled by the second gate structure. Under the combined action of the first threshold-voltage adjustment ions and the second threshold-voltage adjustment ions, balance between the circuit current controlled by the first gate structure and the circuit current controlled by the second gate structure can be improved. As such, the performance of the semiconductor structure is improved.

In one embodiment, the thickness of the first work function layer 415 may be in a range of approximately 30 Å to 130 Å. The thickness of the second work function layer 417 may be in a range of 0 Å to approximately 20 Å.

In one embodiment, the first gate structure may further include a preset work function layer (not shown), and the first work function layer 415 may be disposed on the preset work function layer. The second gate structure may further include a preset work function layer, and the second work function layer 417 may be disposed on the preset work function layer.

The material type of the preset work function layer may be the same as the device type of the semiconductor structure. When the semiconductor structure is a P-type device, the preset work function layer may be made of a P-type work-function material. When the semiconductor structure is an N-type device, the preset work function layer may be made of an N-type work-function material. The preset work function layer may reduce the turn-on voltages of the first gate structure and the second gate structure, such that the overall performance of the semiconductor structure may be improved.

In other embodiments, the semiconductor structure may not include the preset work function layer. That is, the preset work function layer may not be formed.

In one embodiment, the first gate dielectric layer and the second gate dielectric layer may be formed at the same time, and the first gate electrode layer 416 and the second gate electrode layer 418 may be formed at the same time.

Forming the first gate structure and the second gate structure may include the following exemplary steps. A gate dielectric material layer (not shown) may be formed on the substrate 200, the inner-wall surface of the first opening 211, the inner-wall surface of the second opening 212, and the inner-wall surface of the top opening 213. A preset work function layer (not shown) may be formed on the gate dielectric material layer, and a first work-function material layer (not shown) may be formed on the preset work function layer. The first work-function material layer formed on the surface of the second nanowire 240 may then be removed to form a first work function layer 415 on the first nanowire 230, and the second work-function material layer formed on the surface of the first work function layer 415 may be removed to form a second work function layer 417 on the second nanowire 240. A gate-electrode material layer (not shown) may be formed on the second work function layer 417 and the first work function layer 415. The gate-electrode material layer may fill up the first opening 211, the second opening 212, and the top opening 213. Further, the gate-electrode material layer, the work-function material layer, and the gate dielectric material layer may be planarized until the second isolation layer 214 is exposed. As such, the first gate structure and the second gate structure may be formed.

In one embodiment, the etching rate of the first work-function material layer may be different from the etching rate of the second work-function material layer, such that when removing the first work-function material layer, damage to the second work-function material layer may be limited, and when removing the second work-function material layer, damage to the first work-function material layer may be limited.

In one embodiment, the material of the preset work function layer may be the same as the material of the first work-function material layer. In one embodiment, the first work-function material layer may be removed by a wet etching process, and the second work-function material layer may be removed by a wet etching process. The wet etching process is an isotropic etching process, which may ensure that the work-function material layer can be fully removed.

The first work-function material layer may be formed by a CVD process or an ALD process. In one embodiment, the first work-function material layer may be formed by an ALD process. The ALD process may be able to ensure that the formed work function layers have low thickness, desired uniformity, and dense structure.

The second work-function material layer may be formed by a CVD process or an ALD process. In one embodiment, the second work-function material layer may be formed by an ALD process. The ALD process may be able to ensure that the formed work function layers have low thickness, desired uniformity, and dense structure.

The first gate dielectric layer and the second gate dielectric layer may be made of a same material. For example, the first gate dielectric layer and the second gate dielectric layer may be made of a high-K material (a high-K dielectric material refers to a dielectric material having a relative dielectric constant greater than 3.9). The high-K material may include hafnium oxide ($HfO_x$), aluminum oxide ($AlO_x$), or a combination thereof.

The first gate dielectric layer and the second gate dielectric layer may be formed by a CVD process or an ALD process. In one embodiment, the first gate dielectric layer and the second gate dielectric layer may be formed by an ALD process. The ALD process may be able to ensure that the formed gate dielectric layers have low thickness, desired uniformity, and dense structure.

The first gate electrode layer 416 and the second gate electrode layer 418 may be made of a same material. For example, the first gate electrode layer 416 and the second gate electrode layer 418 may be made of a metal, and the metal may include tungsten (W). The first gate electrode layer 416 and the second gate electrode layer 418 may be formed by a PVD process.

Further, a third isolation layer may be formed on the second isolation layer 214 and on the surface of the second gate structure. A source plug may be formed in the third isolation layer, the second isolation layer 214, and the source region 209. A drain plug may be formed in the third isolation layer, the second isolation layer 214, and the drain region 210. For the details of exemplary fabrication steps, processes, and materials, reference may be made to the FIG. 10 and the corresponding description in the embodiments provided above, which will not be repeated here.

Figure 14:
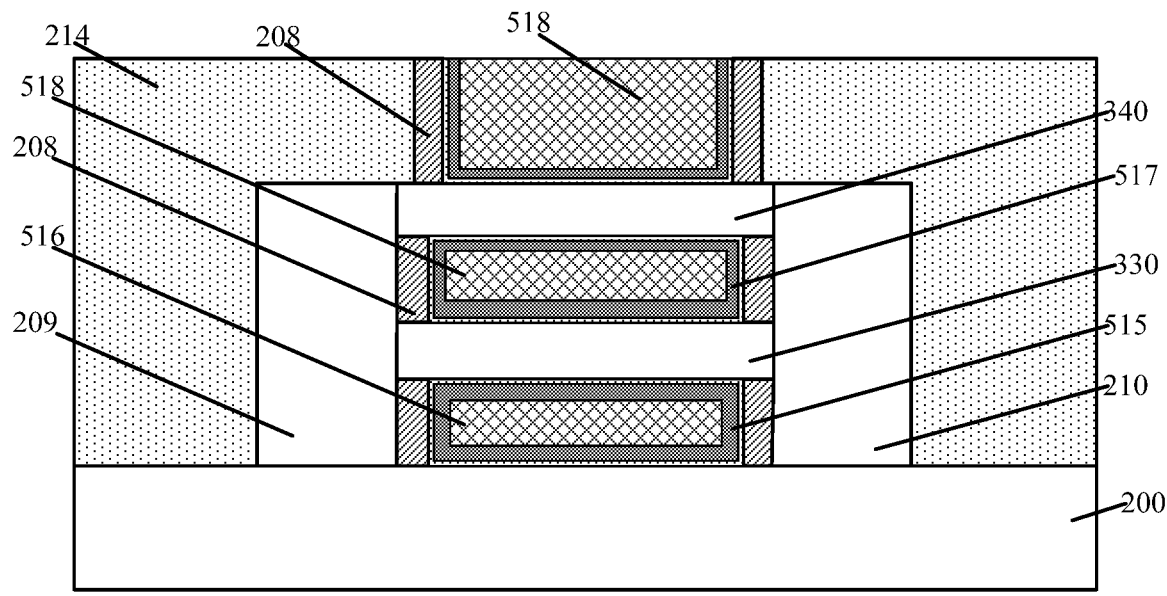
FIG. 14 illustrates a cross-sectional view of a semiconductor structure at a certain stage of another exemplary method for forming a semiconductor structure according to some embodiments of the present disclosure.

FIG. 14 illustrates a cross-sectional view of a semiconductor structure at a certain stage of another exemplary method for forming a semiconductor structure according to some embodiments of the present disclosure. Specifically, the schematic cross-sectional view shown in FIG. 14 is developed from the semiconductor structure shown in FIG. 11.

Referring to FIG. 14, after the first nanowire 330 and the second nanowire 340 are formed, a first gate structure may be formed in the first opening 211, and a second gate structure may be formed in the second opening 212 and the top opening 213.

The first gate structure may be formed across the first nanowire 330 and may surround the first nanowire 330. The second gate structure may be formed across the second nanowire 340 and may surround the second nanowire 340.

The first gate structure may include a first dielectric layer (not shown), a first work function layer 515 formed on the first dielectric layer, and a first gate electrode layer 516 formed on the first work function layer 515. The second gate structure may include a second dielectric layer (not shown), a second work function layer 517 formed on the second dielectric layer, and a second gate electrode layer 518 formed on the second work function layer 517.

In one embodiment, the second work function layer 517 may be different from the first work function layer 515. For example, the second work function layer 517 and the first work function layer 515 may be the same type, and the thickness of the first work function layer 515 may be higher than the thickness of the second work function layer 517.

Because the thickness of the first work function layer 515 is higher than the thickness of the second work function layer 517, the first work function layer 515 may be able to significantly reduce the turn-on voltage of the first gate structure, and the second work function layer 517 may slightly reduce the turn-on voltage of the second gate structure. Therefore, under a same voltage, the circuit current controlled by the first gate structure may be large as compared to the circuit current controlled by the second gate structure. Under the combined action of the first threshold-voltage adjustment ions and the second threshold-voltage adjustment ions, balance between the circuit current controlled by the first gate structure and the circuit current controlled by the second gate structure can be improved. As such, the performance of the semiconductor structure is improved.

When the semiconductor device is an N-type device, the first work function layer and the second work function layer may be made of an N-type work-function material, and the N-type work-function material may include titanium aluminum alloy. When the semiconductor device is a P-type device, the first work function layer and the second work function layer may be made of a P-type work-function material, and the P-type work-function material may include tantalum nitride ($TaN_x$), aluminum nitride ($AlN_x$), or a combination thereof.

In one embodiment, the thickness of the first work function layer 515 may be in a range of approximately 25 Å to 120 Å, and the thickness of the second work function layer 517 may be in a range of 0 Å to approximately 100 Å.

In one embodiment, the first gate dielectric layer and the second gate dielectric layer may be formed at the same time, and the first gate electrode layer 516 and the second gate electrode layer 518 may be formed at the same time.

In one embodiment, forming the first gate structure and the second gate structure may include the following exemplary steps. A gate dielectric material layer (not shown) may be formed on the substrate 200, the inner-wall surface of the first opening 211, the inner-wall surface of the second opening 212, and the inner-wall surface of the top opening 213. Then, an initial work-function material layer (not shown) may be formed on the surface of the gate dielectric layer, and a ninth mask layer (not shown) may be formed in the first opening 211 and on the first nanowire 330. A portion of the initial work-function material layer formed on the surface of the second nanowire 340 may be removed using the ninth mask layer as a mask. As such, the second work function layer 517 and the first work function layer 515 may be formed. Further, a gate-electrode material layer (not shown) may be formed on the surfaces of the second work function layer 517 and the first work function layer 515. The gate-electrode material layer may fill up the first opening 211, the second opening 212, and the top opening 213. The gate electrode material layer, the work function layer, and the gate dielectric layer may be planarized until the surface of the second isolation layer 214 is exposed. As such the first gate structure and the second gate structure may be formed.

In one embodiment, the initial work-function material layer may be removed by a wet etching process. The wet etching process is an isotropic etching process, which may ensure that the formed second work function layer 517 has a uniform thickness.

The first work function layer 515 and the second work function layer 517 may be formed by a CVD process or an ALD process. In one embodiment, the first work function layer 515 and the second work function layer 517 may be formed by an ALD process. The ALD process may be able to ensure that the formed work function layers have low thickness, desired uniformity, and dense structure.

The first gate dielectric layer and the second gate dielectric layer may be made of a same material. For example, the first gate dielectric layer and the second gate dielectric layer may be made a high-K material (a high-K dielectric material refers to a dielectric material having a relative dielectric constant greater than 3.9). The high-K material may include hafnium oxide ($HfO_x$), aluminum oxide ($AlO_x$), or a combination thereof.

The first gate dielectric layer and the second gate dielectric layer may be formed by a CVD process or an ALD process. In one embodiment, the first gate dielectric layer and the second gate dielectric layer may be formed by an ALD process. The ALD process may be able to ensure that the formed gate dielectric layers have low thickness, desired uniformity, and dense structure.

The first gate electrode layer 516 and the second gate electrode layer 518 may be made of a same material. For example, the first gate electrode layer 516 and the second gate electrode layer 518 may be made of a metal, and the metal may include tungsten (W). The first gate electrode layer 516 and the second gate electrode layer 518 may be formed by a PVD process.

Further, a third isolation layer may be formed on the second isolation layer 214 and on the surface of the second gate structure. A source plug may be formed in the third isolation layer, the second isolation layer 214, and the source region 209. A drain plug may be formed in the third isolation layer, the second isolation layer 214, and the drain region 210. For specific processes, processing, and materials, reference is made referred to FIG. 10, which is not be repeated here.

Figure 15:
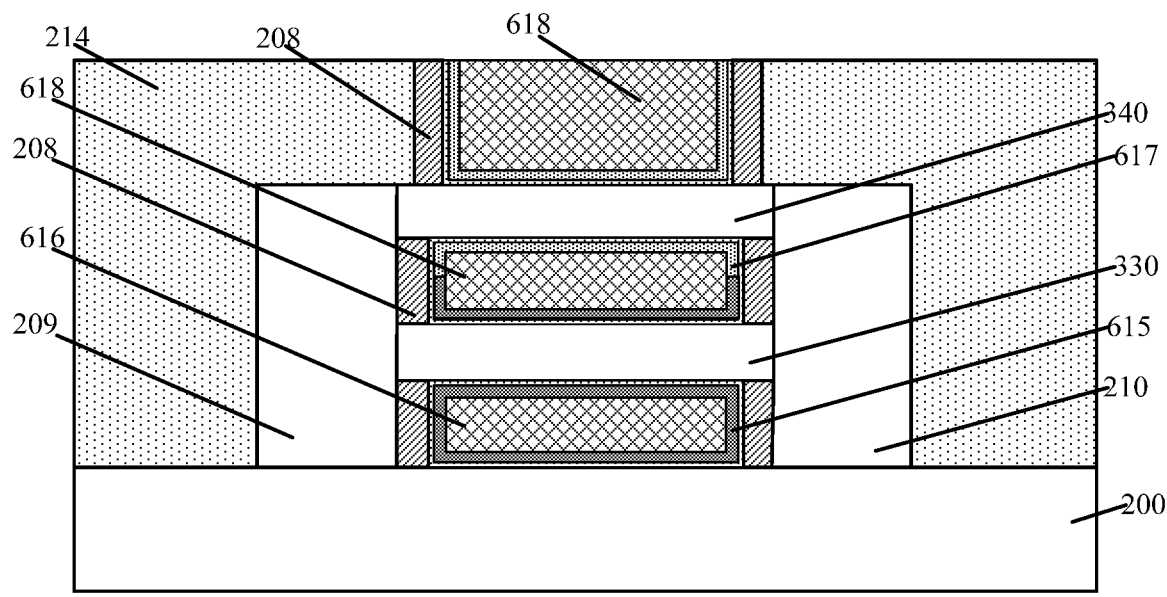
FIG. 15 illustrates a cross-sectional view of a semiconductor structure at a certain stage of another exemplary method for forming a semiconductor structure according to some embodiments of the present disclosure.

FIG. 15 illustrates a cross-sectional view of a semiconductor structure at a certain stage of another exemplary method for forming a semiconductor structure according to some embodiments of the present disclosure. Specifically, the schematic cross-sectional view shown in FIG. 15 is developed from the semiconductor structure shown in FIG. 11.

Referring to FIG. 15, after the first nanowire 330 and the second nanowire 340 are formed, a first gate structure may be formed in the first opening 211, and a second gate structure may be formed in the second opening 212 and the top opening 213.

The first gate structure may be formed across the first nanowire 330 and may surround the first nanowire 330. The second gate structure may be formed across the second nanowire 340 and may surround the second nanowire 340.

The first gate structure may include a first dielectric layer (not shown), a first work function layer 615 formed on the first dielectric layer, and a first gate electrode layer 516 formed on the first work function layer 615. The second gate structure may include a second dielectric layer (not shown), a second work function layer 617 formed on the second dielectric layer, and a second gate electrode layer 618 formed on the second work function layer 617.

In one embodiment, the second work function layer 617 may be different from the first work function layer 615. For example, the type of the second work function layer 617 may be opposite to the type of the first work function layer 615.

When the semiconductor structure is an N-type device, the first work function layer 615 may be made of an N-type work-function material, and the second work function layer 617 may be made of a P-type work-function material. When the semiconductor device is a P-type device, the first work function layer 615 may be made of the P-type work-function material, and the second work function layer 617 may be made of the N-type work-function material. The P-type work-function material may include tantalum nitride ($TaN_x$), aluminum nitride ($AlN_x$), or a combination thereof. The N-type work-function material may include titanium aluminum alloy.

Because the type of the second work function layer 617 is opposite to the type of the first work function layer 615, the first work function layer 615 may reduce the turn-on voltage of the first gate structure, and the second work function layer 617 may increase the turn-on voltage of the second gate structure. Therefore, under a same voltage, the circuit current controlled by the first gate structure may be large as compared to the circuit current controlled by the second gate structure. Under the combined action of the first threshold-voltage adjustment ions and the second threshold-voltage adjustment ions, balance between the circuit current controlled by the first gate structure and the circuit current controlled by the second gate structure can be improved. As such, the performance of the semiconductor structure is improved.

In one embodiment, the thickness of the first work function layer 615 may be in a range of approximately 30 Å to 130 Å. The thickness of the second work function layer 617 may be in a range of 0 Å to approximately 20 Å.

In one embodiment, the first gate structure may further include a preset work function layer (not shown), and the first work function layer 615 may be disposed on the preset work function layer. The second gate structure may further include a preset work function layer, and the second work function layer 617 may be disposed on the preset work function layer.

The material type of the preset work function layer may be the same as the device type of the semiconductor structure. When the semiconductor structure is a P-type device, the preset work function layer may be made of a P-type work-function material. When the semiconductor structure is an N-type device, the preset work function layer may be made of an N-type work-function material. The preset work function layer may reduce the turn-on voltages of the first gate structure and the second gate structure, such that the overall performance of the semiconductor structure may be improved.

In other embodiments, the semiconductor structure may not include the preset work function layer. That is, the preset work function layer may not be formed.

In one embodiment, the first gate dielectric layer and the second gate dielectric layer may be formed at the same time, and the first gate electrode layer 616 and the second gate electrode layer 618 may be formed at the same time.

Forming the first gate structure and the second gate structure may include the following exemplary steps. A gate dielectric material layer (not shown) may be formed on the substrate 200, the inner-wall surface of the first opening 211, the inner-wall surface of the second opening 212, and the inner-wall surface of the top opening 213. A preset work function layer (not shown) may be formed on the gate dielectric material layer, and a first work-function material layer (not shown) may be formed on the preset work function layer. The first work-function material layer formed on the surface of the second nanowire 340 may then be removed to form a first work function layer 615 on the first nanowire 330, and the second work-function material layer formed on the surface of the first work function layer 615 may be removed to form a second work function layer 617 on the second nanowire 340. A gate-electrode material layer (not shown) may be formed on the second work function layer 617 and the first work function layer 615. The gate-electrode material layer may fill up the first opening 211, the second opening 212, and the top opening 213. Further, the gate-electrode material layer, the work-function material layer, and the gate dielectric material layer may be planarized until the surface of the second isolation layer 214 is exposed. As such, the first gate structure and the second gate structure may be formed.

In one embodiment, the etching rate of the first work-function material layer may be different from the etching rate of the second work-function material layer, such that when removing the first work-function material layer, damage to the second work-function material layer may be limited, and when removing the second work-function material layer, damage to the first work-function material layer may be limited.

In one embodiment, the material of the preset work function layer may be the same as the material of the first work-function material layer. In one embodiment, the first work-function material layer may be removed by a wet etching process, and the second work-function material layer may be removed by a wet etching process. The wet etching process is an isotropic etching process, which may ensure that the work-function material layer can be fully removed.

The first work-function material layer may be formed by a CVD process or an ALD process. In one embodiment, the first work-function material layer may be formed by an ALD process. The ALD process may be able to ensure that the formed work function layers have low thickness, desired uniformity, and dense structure.

The second work-function material layer may be formed by a CVD process or an ALD process. In one embodiment, the second work-function material layer may be formed by an ALD process. The ALD process may be able to ensure that the formed work function layers have low thickness, desired uniformity, and dense structure.

The first gate dielectric layer and the second gate dielectric layer may be made of a same material. For example, the first gate dielectric layer and the second gate dielectric layer may be made of a high-K material (a high-K dielectric material refers to a dielectric material having a relative dielectric constant greater than 3.9). The high-K material may include hafnium oxide ($HfO_x$), aluminum oxide ($AlO_x$), or a combination thereof.

The first gate dielectric layer and the second gate dielectric layer may be formed by a CVD process or an ALD process. In one embodiment, the first gate dielectric layer and the second gate dielectric layer may be formed by an ALD process. The ALD process may be able to ensure that the formed gate dielectric layers have low thickness, desired uniformity, and dense structure.

The first gate electrode layer 616 and the second gate electrode layer 618 may be made of a same material. For example, the first gate electrode layer 616 and the second gate electrode layer 618 may be made of a metal, and the metal may include tungsten (W). The first gate electrode layer 616 and the second gate electrode layer 618 may be formed by a PVD process.

Further, a third isolation layer may be formed on the second isolation layer 214 and on the surface of the second gate structure. A source plug may be formed in the third isolation layer, the second isolation layer 214, and the source region 209. A drain plug may be formed in the third isolation layer, the second isolation layer 214, and the drain region 210. For the details of exemplary fabrication steps, processes, and materials, reference may be made to the FIG. 10 and the corresponding description in the embodiments provided above, which will not be repeated here.

Figure 23:
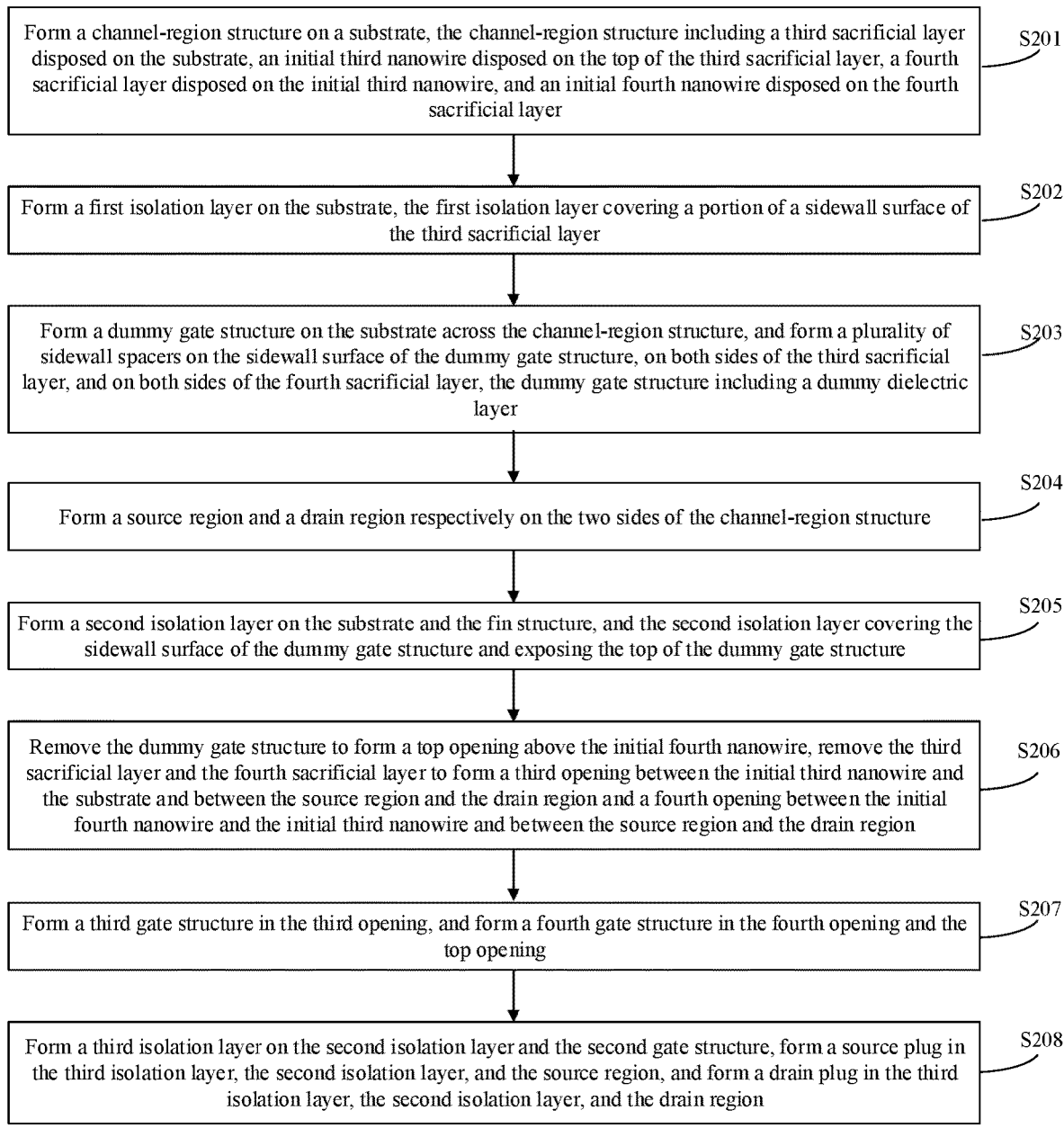
FIG. 23 illustrates a flowchart of another exemplary method for forming a semiconductor structure according to some embodiments of the present disclosure.

The present disclosure also provides another method for forming a semiconductor structure. FIG. 23 illustrates a flowchart of another exemplary method for forming a semiconductor structure according to some embodiments of the present disclosure. FIGS. 16-20 illustrate schematic cross-sectional views of semiconductor structures at certain stages of the exemplary method.

Figure 16:
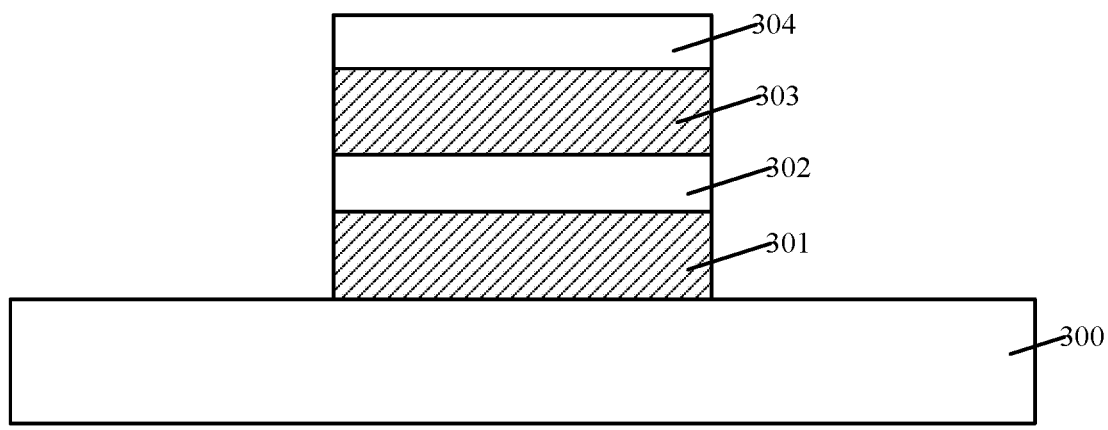
FIGS. 16-20 illustrate schematic cross-sectional views of semiconductor structures at certain stages of another exemplary method for forming a semiconductor structure according to some embodiments of the present disclosure.

Referring to FIG. 23, in S201, a channel-region structure may be formed on a substrate. FIG. 16 illustrates a schematic cross-sectional view of a semiconductor structure according to some embodiments of the present disclosure.

Referring to FIG. 16, a substrate 300 may be provided, and a channel-region structure may be formed on the substrate 300. The channel-region structure may be located in a channel region of the to-be-formed semiconductor structure and may include a stack structure of multiple fin units. Each fin unit may include a sacrificial layer and an initial nanowire disposed on top of the sacrificial layer, and the sacrificial layer and the initial nanowire may be made of different materials.

In one embodiment, the channel-region structure may include a third fin unit, and a fourth fin unit located above the third fin unit. The third fin unit may include a third sacrificial layer 301 disposed on the substrate 300 and an initial third nanowire 302 disposed on the top of the third sacrificial layer 301. The fourth fin unit may include a fourth sacrificial layer 303 disposed on the initial third nanowire 302 and an initial fourth nanowire 304 disposed on the top of the fourth sacrificial layer 303.

In one embodiment, the substrate 300 may be made of silicon (Si). In other embodiments, the substrate may be made of silicon-germanium (SiGe), germanium (Ge), silicon on insulator (SOI), or germanium on insulator (GOI).

In one embodiment, forming the third fin unit and the fourth fin unit may include the following exemplary steps. A third sacrificial material layer (not shown) may be formed on the substrate 300, a third nanowire material layer (not shown) may be formed on the third sacrificial material layer, a fourth sacrificial material layer (not shown) may be formed on the third nanowire material layer, a fourth nanowire material layer (not shown) may be formed on the fourth sacrificial material layer, and a first patterned layer (not shown) may be formed on the fourth nanowire material layer. Then, the nanowire material layers (including the third nanowire material layer and the fourth nanowire material layer) and the sacrificial material layers (including the third sacrificial material layer and the fourth sacrificial material layer) may be etched using the first patterned layer as an etch mask until exposing the substrate 300, such that the third sacrificial material layer may become the third sacrificial layer 301, the third nanowire material layer may become the initial third nanowire 302, the fourth sacrificial material layer may become the fourth sacrificial layer 303, and the fourth nanowire material layer may become the initial fourth nanowire 304. As such, the channel-region structure may be formed.

The sacrificial layer and the nanowire may be made of different materials. For example, the third sacrificial layer 301 and the fourth sacrificial layer 303 may be made of a material including single-crystalline silicon (Si) or single-crystalline silicon-germanium (SiGe), and the initial third nanowire 302 and the initial fourth nanowire 304 may be formed by a material including single-crystalline silicon (Si), or single-crystalline silicon-germanium (SiGe). In one embodiment, the third sacrificial layer 301 and the fourth sacrificial layer 303 may be made of silicon-germanium (SiGe). The initial third nanowire 302 and the initial fourth nanowire 304 may be made of single-crystalline silicon (Si).

The sacrificial layer and the nanowire may be made of different materials. Therefore, the etching rate of the sacrificial layer may be different from the etching rate of the nanowire during the etching process. As such, when the sacrificial layer is subsequently removed, damage to the nanowire may be limited.

Further, referring to FIG. 23, in S202, after forming the channel-region structure, a first isolation layer may be formed on the substrate, and the first isolation layer may cover a portion of the sidewall surface of the third sacrificial layer.

After forming the channel-region structure, a first isolation layer (not shown) may be formed on the substrate 300, and the first isolation layer may cover a portion of the sidewall surface of the third sacrificial layer 301. In one embodiment, the first isolation layer may be used to electrically isolate the subsequently-formed gate structure and the substrate 300, thereby preventing degradation of the performance of the semiconductor structure.

Figure 17:
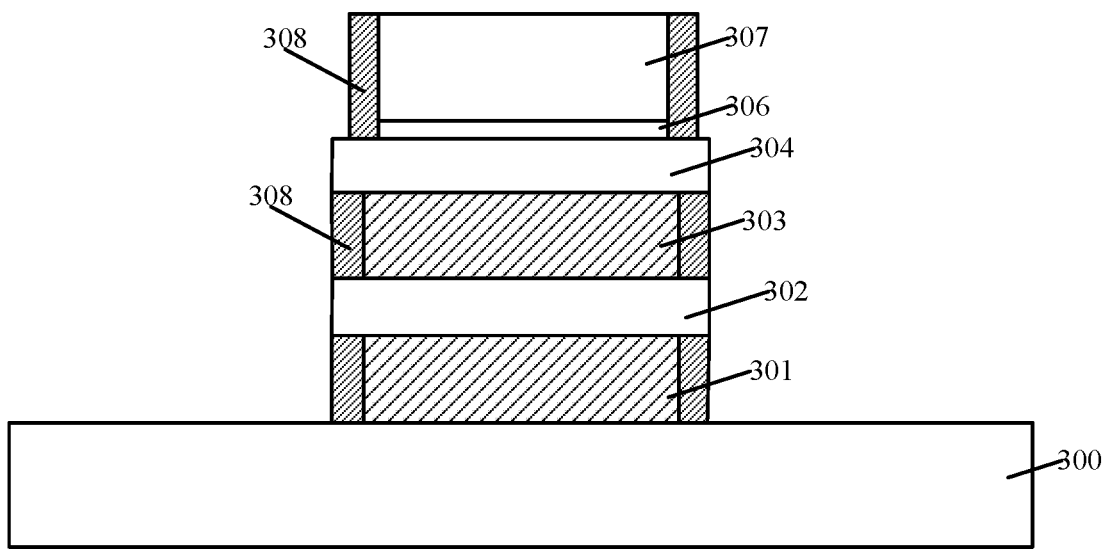

Returning to FIG. 23, in S203, a dummy gate structure may be formed on the substrate, and a plurality of sidewall spacers may be formed on the sidewall surface of the dummy gate structure, on both sides of the third sacrificial layer, and also on both sideway of the fourth sacrificial layer. FIG. 17 illustrates a schematic cross-sectional view of a semiconductor structure according to some embodiments of the present disclosure.

Referring to FIG. 17, a dummy gate structure may be formed on the substrate 200 across the channel-region structure. A plurality of sidewall spacers 308 may be formed on the sidewall surface of the dummy gate structure, on both sides of the third sacrificial layer 301, and also on both sides of the fourth sacrificial layer 303.

The dummy gate structure may include a dummy dielectric layer 306 and a dummy gate electrode layer 307 formed on the dummy dielectric layer 306.

In one embodiment, forming the dummy gate structure may include the following exemplary steps. A dummy gate dielectric film (not shown) covering the channel-region structure may be formed over the substrate 300, a dummy gate film (not shown) may be formed on the dummy gate dielectric film, and then a second patterned layer (not shown) may be formed on the dummy gate film. The second patterned layer may define the position and dimension of the dummy gate structure. Further, the dummy dielectric film and the dummy gate film may be etched using the second patterned layer as an etch mask until exposing the channel-region structure. As such, the dummy gate structure may be formed on the channel-region structure.

In one embodiment, the dummy gate dielectric film and the dummy gate film may be etched by a dry etching process. In one embodiment, the dummy gate dielectric layer 306 may be made of silicon oxide ($SiO_x$). The dummy gate dielectric film may be formed by a chemical vapor deposition (CVD) process, an atomic layer deposition (ALD) process, or a thermal oxidation process.

In one embodiment, the dummy gate electrode layer 307 may be made of silicon (Si), and the dummy gate film may be formed by a PVD process.

In one embodiment, the dummy gate structure may further include a protective layer (not shown) formed on the dummy gate electrode layer 307. The protective layer may be used to protect the dummy gate electrode layer 307 during the formation of the source region and the drain region. In addition, the protective layer may also serve as a stop layer for subsequently planarizing an initial second isolation layer.

The protective layer may be made of silicon oxide ($SiO_x$) or silicon nitride ($SiN_x$). In one embodiment, the protective layer may be made of silicon nitride ($SiN_x$).

In one embodiment, forming the plurality of sidewall spacers 308 may include the following exemplary steps. After forming the dummy gate structure, a portion of the third sacrificial layer 301 and the fourth sacrificial layer 303 may be removed, such that the third sacrificial layer 301 may recess inwardly with respect to the sidewall surface of the initial third nanowire 302, and the fourth sacrificial layer 303 may also recess inwardly with respect to the sidewall surface of the initial fourth nanowire 304. After removing portion of the third sacrificial layer 301 and the fourth sacrificial layer 303, a sidewall spacer material film (not shown) may be formed on the sidewall surface of the dummy gate structure and the sidewall surface of the channel-region structure. The sidewall spacer material film may be etched back to expose the sidewall surface of the initial third nanowire 302 and the sidewall surface of the initial fourth nanowire 304. Thus, the plurality of sidewall spacers 308 may be formed on the sidewall surface of the dummy gate structure, on both sides of the third sacrificial layer 301, and also on both sides of the fourth sacrificial layer 303.

According to the disclosed method, a portion of the third sacrificial layer 301 and the fourth sacrificial layer 303 may be removed to make the third sacrificial layer 301 recess inwardly with respect to the sidewall of the initial third nanowire 302 and the fourth sacrificial layer 303 recess inwardly with respect to the sidewall of the initial fourth nanowire 304, thereby providing space for forming the plurality of sidewall spacers 308 on both sides of the third sacrificial layer 301 and also on both sides of the fourth sacrificial layer 303. In one embodiment, the third sacrificial layer 301 and the fourth sacrificial layer 303 may be removed by a wet etching process.

The plurality of sidewall spacers 308 may be made of a material including silicon oxide ($SiO_x$), silicon nitride ($SiN_x$), and silicon oxynitride (SiON). In one embodiment, the plurality of sidewall spacers 308 may be made of silicon nitride ($SiN_x$). In one embodiment, the sidewall spacer material film may be formed by a CVD process or an ALD process.

Figure 18:
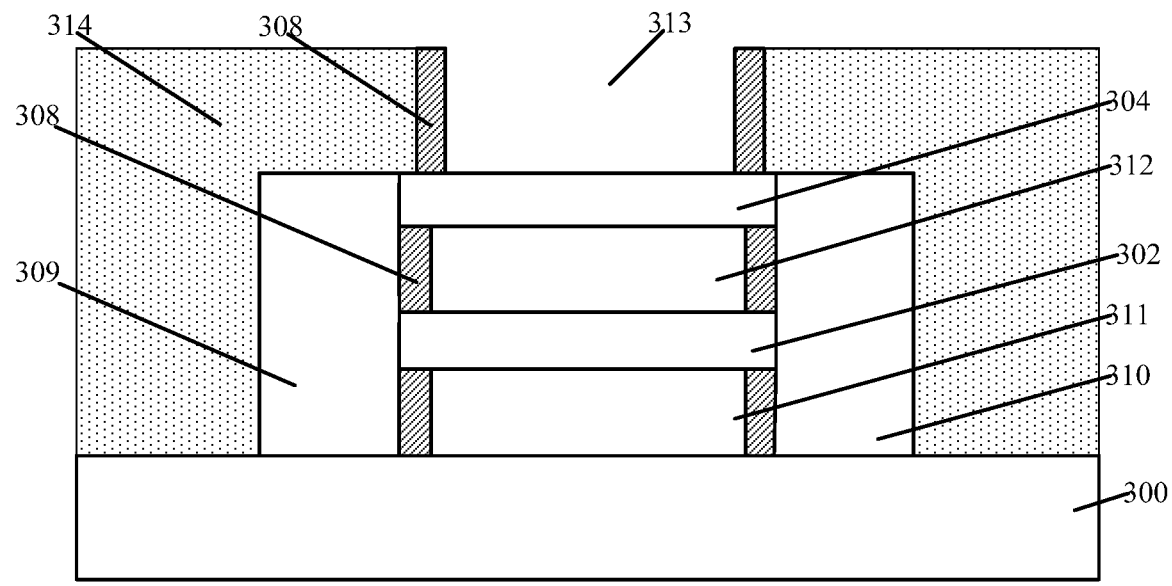

Returning to FIG. 23, in S204, a source region and a drain region may be formed respectively on the two sides of the channel-region structure. FIG. 18 illustrates a schematic cross-sectional view of a semiconductor structure according to some embodiments of the present disclosure.

Referring to FIG. 18, a source region 309 and a drain region 310 may be formed on the substrate 300. The source region 309 and the drain region 310 may be respectively located on the two sides of the channel-region structure. After the source region 309 and the drain region 310 are formed, the dummy gate structure may be removed in a subsequent process, and after the dummy gate structure is removed, the third sacrificial layer 301 and the fourth sacrificial layer 303 may be removed.

Forming the source region 309 and the drain region 310 may include the following exemplary steps. A trench (not shown) may be formed in the dummy gate structure on each side of the fin structure. In a lateral direction, the trench may be separated from the fin structure by a sidewall spacer 308. Therefore, corresponding to the two sides of the fin structure, two trenches may be formed. After forming the two trenches, the source region 309 and the drain region 310 may be formed in the two trenches. In one embodiment, the source region 309 and the drain region 310 may be formed by an epitaxial growth process.

The source region 309 and the drain region 310 may contain source-drain doping ions. In one embodiment, the source-drain doping ions may be doped into the source region 309 and the drain region 310 by an in-situ doping process. In other embodiments, the source region 309 and the drain region 310 may be formed by an ion implantation process.

When the semiconductor device is a P-type device, the source region 309 and the drain region 310 may be formed by a material including silicon (Si), germanium (Ge), or silicon-germanium (SiGe). The source-drain doping ions may be P-type ions, including boron ions, $BF'$ ions, indium ions, or a combination thereof.

When the semiconductor device is an N-type device, the source region 309 and the drain region 310 may be made of a material including silicon (Si), gallium arsenide (GaAs), or indium gallium arsenide (InGaAs). The source-drain doping ions may be N-type ions, including phosphorus ions, arsenic ions, or a combination thereof.

Returning to FIG. 23, in S205, after the source region and the drain region are formed, a second isolation layer may be formed on the substrate and the fin structure, and the second isolation layer may cover the sidewall surface of the dummy gate structure and expose the top of the dummy gate structure. The semiconductor structure shown in FIG. 18 includes a second isolation layer formed on the substrate and the fin structure according to some embodiments of the present disclosure.

Referring to FIG. 18, after the source region 309 and the drain region 310 are formed, a second isolation layer 314 may be formed over the substrate and the fin structure. The second isolation layer 314 may cover the sidewall surface of the dummy gate structure and expose the top of the dummy gate structure. The second isolation layer 314 may be used to electrically isolate adjacent semiconductor devices.

Forming the second isolation layer 314 may include the following exemplary steps. An initial second isolation layer (not shown) may be formed over the source region 309, the drain region 310, the dummy gate structure, and the plurality of sidewall spacers 308. The initial second isolation layer may cover the top and sidewall surfaces of the dummy gate structure. Then, the initial second isolation layer may be planarized until exposing the surface of the dummy gate protective layer formed on the dummy gate structure. As such, the second isolation layer 314 may be formed. In one embodiment, the top surface of the isolation layer 314 is leveled with the top surface of the dummy gate structure.

In one embodiment, the second isolation layer 314 may be made of silicon oxide ($SiO_x$). In one embodiment, the initial second isolation layer may be planarized by a chemical mechanical polishing (CMP) process.

Further, returning to FIG. 23, in S206, after the second isolation layer is formed, the dummy gate structure may be removed to form a top opening above the initial fourth nanowire, after the dummy gate structure is removed, the third sacrificial layer and the fourth sacrificial layer may be removed to form a third opening between the initial third nanowire and the substrate and between the source region and the drain region and also form a fourth opening between the initial fourth nanowire and the initial third nanowire and between the source region and the drain region. The semiconductor structure shown in FIG. 18 includes a top opening, a third opening, a fourth opening according to some embodiments of the present disclosure.

Referring to FIG. 18, after the second isolation layer 314 is formed, the dummy gate structure may be removed to form a top opening 313 above the initial fourth nanowire 304. Further, after the dummy gate structure is removed, the third sacrificial layer 301 and the fourth sacrificial layer 303 may be removed to form a third opening 311 and a fourth opening 312. The first opening 311 may be located between the initial third nanowire 302 and substrate 300 and between the source region 309 and the drain region 310, and the fourth opening 312 may be located between the initial fourth nanowire 304 and the initial third nanowire 302 and between the source region 309 and the drain region 310.

The initial third nanowire 302 may be used as a channel for a third gate structure that is subsequently formed in the third opening. The initial fourth nanowire 304 may be used as a channel for a fourth gate structure that is subsequently formed in the fourth opening.

Removing the dummy gate structure may include removing the dummy gate electrode layer 307 and, after removing the dummy gate electrode layer 307, removing the dummy gate dielectric layer 306. The dummy gate electrode layer 307 may be removed by a dry etching process, a wet etching process, or a combination thereof. The dummy gate dielectric layer 306 may be removed by a dry etching process, a wet etching process, or a combination thereof.

Further, after the dummy gate structure is removed, the third sacrificial layer 301 and the fourth sacrificial layer 303 may be exposed. The third sacrificial layer 301 and the fourth sacrificial layer 303 may be removed by a wet etching process.

Because the sacrificial layers (including, for example, the third sacrificial layer 301 and the fourth sacrificial layer 303) are made of a material different from the material of the nanowires (including, for example, the initial third nanowire 302 and the initial fourth nanowire 304), the etching solution used in the wet etching process may have an etching rate on the sacrificial layers different from an etching rate on the nanowires. The etching solution may be used to remove the third sacrificial layer 301 and the fourth sacrificial layer 303, and thus the etching rate of the initial third nanowire 302 and the initial fourth nanowire 304 is relatively small, such that damage to the initial third nanowire 302 and the initial fourth nanowire 304 during the wet etching process may be limited.

In other embodiments, the fabrication method may further include doping third threshold-voltage adjustment ions into the initial third nanowire 302, and doping fourth threshold-voltage adjustment ions into the initial fourth nanowire 304. For the details of the doping type of the threshold-voltage adjustment ions, methods, and fabrication processes, reference may be made to the FIG. 8 and FIG. 11 and the corresponding description in the embodiments provided above, which will not be repeated here.

Figure 19:
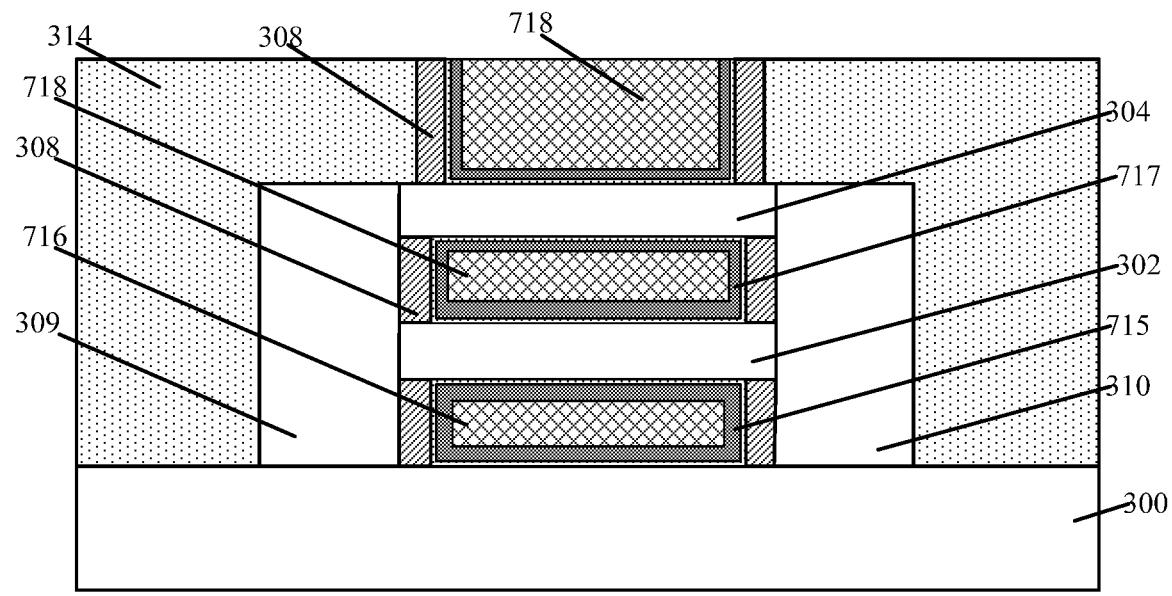

Returning to FIG. 23, in S207, a third gate structure may be formed in the third opening, and a fourth gate structure may be formed in the fourth opening and the top opening. FIG. 19 illustrates a schematic cross-sectional view of a semiconductor structure according to some embodiments of the present disclosure.

Referring to FIG. 19, a third gate structure may be formed in the third opening 311, and a fourth gate structure may be formed in the fourth opening 312 and the top opening 313.

The third gate structure may be formed across the third nanowire 302 and may surround the third nanowire 302. The fourth gate structure may be formed across the fourth nanowire 304 and may surround the fourth nanowire 304.

The third gate structure may include a third gate dielectric layer (not shown), a third work function layer 715 formed on the third gate dielectric layer, and a third gate electrode layer 716 formed on the third work function layer 715. The fourth gate structure may include a fourth gate dielectric layer (not shown), a fourth work function layer 717 formed on the fourth gate dielectric layer, and a fourth gate electrode layer 718 formed on the fourth work function layer 717.

In one embodiment, the third gate structure may be different from the fourth gate structure. In one embodiment, the type of the third work function layer 715 may be the same as the type of the fourth work function layer 717, and the thickness of the third work function layer 715 may be different from the thickness of the fourth work function layer 717.

Because the thickness of the third work function layer 715 is higher than the thickness of the fourth work function layer 717, the third work function layer 715 may be able to significantly reduce the turn-on voltage of the third gate structure, and the fourth work function layer 717 may slightly reduce the turn-on voltage of the fourth gate structure. Therefore, under a same voltage, the circuit current controlled by the third gate structure may be large as compared to the circuit current controlled by the fourth gate structure. As such, balance between the circuit current controlled by the third gate structure and the circuit current controlled by the fourth gate structure can be improved, which may further improve the performance of the semiconductor structure.

When the semiconductor device is an N-type device, the third work function layer and the fourth work function layer may be made of an N-type work-function material, and the N-type work-function material may include titanium aluminum alloy. When the semiconductor device is a P-type device, the first work function layer and the second work function layer may be made of a P-type work-function material, and the P-type work-function material may include tantalum nitride ($TaN_x$), aluminum nitride ($AlN_x$), or a combination thereof.

In one embodiment, the thickness of the third work function layer 715 may be in a range of approximately 25 Å to 120 Å, and the thickness of the fourth work function layer 717 may be in a range of 0 Å to approximately 100 Å.

In one embodiment, the third gate dielectric layer and the fourth gate dielectric layer may be formed at the same time, and the third gate electrode layer 716 and the fourth gate electrode layer 718 may be formed at the same time.

In one embodiment, forming the third gate structure and the fourth gate structure may include the following exemplary steps. A gate dielectric material layer (not shown) may be formed on the surface of the substrate 300, the inner-wall surface of the third opening 311, the inner-wall surface of the fourth opening 312, and the inner-wall surface of the top opening 313. Then, an initial work-function material layer (not shown) may be formed on the gate dielectric material layer, and a patterned layer (not shown) may be formed in the third opening 311 on the third nanowire 302. A portion of the initial work-function material layer formed on the surface of the fourth nanowire 304 may be removed using the patterned layer as a mask. As such, the fourth work function layer 717 and the third work function layer 715 may be formed. A gate-electrode material layer (not shown) may be formed on the surfaces of the fourth work function layer 717 and the third work function layer 715, and the gate-electrode material layer may fill up the third opening 311, the fourth opening 312, and the top opening 313. Further, the gate-electrode material layer, the fourth work function layer 717, the third work function layer 715, and the gate dielectric material layer may be planarized until the surface of the second isolation layer 314 is exposed. As such, the third gate structure and the fourth gate structure may be formed.

In one embodiment, the portion of the initial work-function material layer may be removed by a wet etching process. The wet etching process is an isotropic etching process, which may ensure that the formed fourth work function layer 717 has a uniform thickness.

The third work function layer 715 and the fourth work function layer 717 may be formed by a CVD process or an ALD process. In one embodiment, the third work function layer 715 and the fourth work function layer 717 may be formed by an ALD process. The ALD process may be able to ensure that the formed work function layers have low thickness, desired uniformity, and dense structure.

The third gate dielectric layer and the fourth gate dielectric layer may be made of a same material. The third gate dielectric layer and the fourth gate dielectric layer may be made of a high-K material (a high-K dielectric material refers to a dielectric material having a relative dielectric constant greater than 3.9). The high-K material may include hafnium oxide ($HfO_x$), aluminum oxide ($AlO_x$), or a combination thereof.

The third gate dielectric layer and the fourth gate dielectric layer may be formed by a CVD process or an ALD process. In one embodiment, the third gate dielectric layer and the fourth gate dielectric layer may be formed by an ALD process. The ALD process may be able to ensure that the formed gate dielectric layers have low thickness, desired uniformity, and dense structure.

The third gate electrode layer 716 and the fourth gate electrode layer 718 may be made of a same material. In one embodiment, the third gate electrode layer 716 and the fourth gate electrode layer 718 may be made of a metal, and the metal may include tungsten (W). The third gate electrode layer 716 and the fourth gate electrode layer 718 may be formed by a PVD process.

Figure 20:
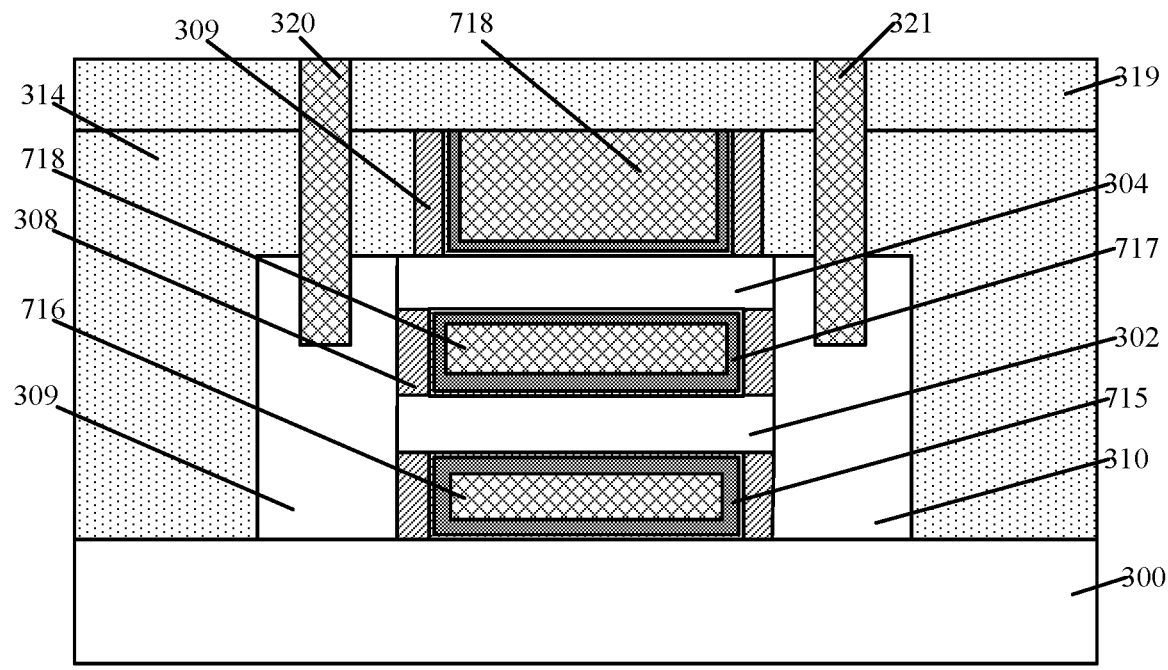

Returning to FIG. 23, in S208, after the third gate structure and the fourth gate structure are formed, a third isolation layer may be formed on the second isolation layer and on the surface of the fourth gate structure, a source plug may be formed in the third isolation layer, the second isolation layer, and the source region, and a drain plug may be formed in the third isolation layer, the second isolation layer, and the drain region. FIG. 20 illustrates a schematic cross-sectional view of a semiconductor structure according to some embodiments of the present disclosure.

Referring to FIG. 20, after the third gate structure and the fourth gate structure are formed, a third isolation layer 319 may be formed on the surface of the second isolation layer 314 and on the surface of the fourth gate structure. A source plug 320 may be formed in the third isolation layer 319, the second isolation layer 314, and the source region 309. A drain plug 321 may be formed in the third isolation layer 319, the second isolation layer 314, and the drain region 310.

The third isolation layer 319 may be used to protect the gate structures from being damaged during the formation of the source plug 320 and the drain plug 321. In the meantime, the third isolation layer 319 and the second isolation layer 314 may together provide structural support for the source plug 320 and the drain plug 321. In one embodiment, the third isolation layer 319 may be made of silicon oxide ($SiO_x$).

In one embodiment, the source plug 320 and the drain plug 321 may be formed at the same time. Forming the source plug 320 and the drain plug 321 may include the following exemplary steps. A patterned layer (not shown) exposing a portion of the third isolation layer 319 may be formed on the third isolation layer 319. The third isolation layer 319, the second isolation layer 314, the source region 309, and the drain region 310 may be etched using the patterned layer as a mask to form a trench in the third isolation layer 319, the second isolation layer 314, the source region 309, and the drain region 310. Further, a plug material layer (not shown) may be formed in the trench, and the plug material layer may then be planarized until exposing the third isolation layer 319 to form the source plug 320 and the drain plug 321.

In one embodiment, the third isolation layer 319, the second isolation layer 314, the source region 309, and the drain region 310 may be etched by a dry etching process. In one embodiment, the plug material layer may be planarized by a CMP process.

In the semiconductor structure formed by the method described above, the circuit current controlled by the third gate structure and the circuit current controlled by the fourth gate structure are relatively balanced, and thus the performance of the semiconductor structure may be improved.

Further, the present disclosure also provides a semiconductor structure formed by the method described above. FIG. 20 illustrates a schematic cross-sectional view of an exemplary semiconductor structure according to some embodiments of the present disclosure.

Referring to FIG. 20, the semiconductor structure may include a substrate 300 and a fin structure formed on the substrate 300. The fin structure may include a channel region (for example, a channel-region structure is formed in the channel region), a source region 309, and a drain region 310. The channel-region structure may include a third nanowire 302 and a fourth nanowire 304 located above the third nanowire 302. The semiconductor structure may further include a third opening formed between the third nanowire 302 and the substrate 300 and between the source region 309 and the drain region 310, and a fourth opening formed between the fourth nanowire 304 and the third nanowire 302 and between the source region 309 and the drain region 310.

The semiconductor structure may include a third gate structure formed in the third opening and across the third nanowire 302. The third gate structure may surround the third nanowire 302, and the third gate structure may also include a third work function layer 715.

The semiconductor structure may also include a fourth gate structure formed in the fourth opening and across the fourth nanowire 304. The fourth gate structure may surround the fourth nanowire 304, and the fourth gate structure may also include a fourth work function layer 717. The fourth work function layer 717 may be different from the third work function layer 715.

In one embodiment, the type of the third work function layer 715 may be the same as the type of the fourth work function layer 717, and the thickness of the third work function layer 715 may be higher than the thickness of the fourth work function layer 717. In other embodiments, the type of the third work function layer 715 may be opposite to the fourth work function layer 717.

Figure 21:
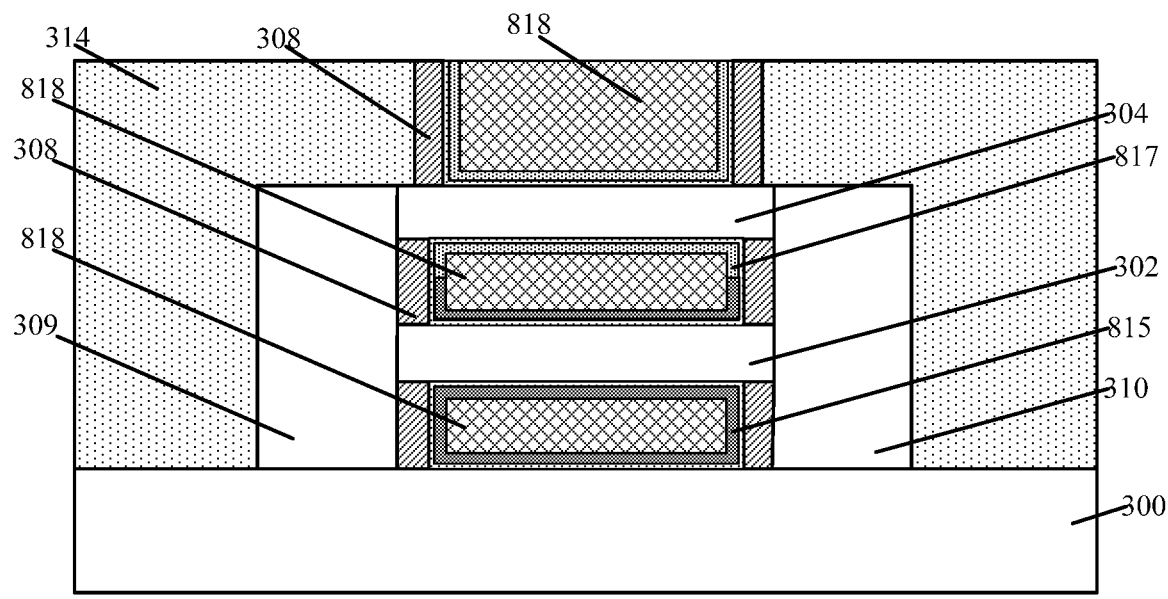
FIG. 21 illustrates a cross-sectional view of a semiconductor structure at a certain stage of another exemplary method for forming a semiconductor structure according to some embodiments of the present disclosure.

FIG. 21 illustrates a cross-sectional view of a semiconductor structure at a certain stage of another exemplary method for forming a semiconductor structure according to some embodiments of the present disclosure. Specifically, the schematic cross-sectional view shown in FIG. 21 is developed from the semiconductor structure shown in FIG. 18.

Referring to FIG. 21, a third gate structure may be formed in the third opening 311, and a fourth gate structure may be formed in the fourth opening 312 and the top opening 313. The third gate structure may be formed across the third nanowire 302 and may surround the third nanowire 302. The fourth gate structure may be formed across the fourth nanowire 304 and may surround the fourth nanowire 304.

The third gate structure may include a third gate dielectric layer (not shown), a third work function layer 815 formed on the third gate dielectric layer, and a third gate electrode layer 816 formed on the third work function layer 815. The fourth gate structure may include a fourth gate dielectric layer (not shown), a fourth work function layer 817 formed on the fourth gate dielectric layer, and a fourth gate electrode layer 818 formed on the fourth work function layer 817.

In one embodiment, the third gate structure may be different from the fourth gate structure. In one embodiment, the type of the third work function layer 815 may be opposite to the type of the fourth work function layer 817.

When the semiconductor structure is an N-type device, the third work function layer 815 may be made of an N-type work-function material, and the fourth work function layer 817 may be made of a P-type work-function material. When the semiconductor structure is a P-type device, the third work function layer 815 may be made of a P-type work-function material, and the fourth work function layer 817 may be made of an N-type work-function material. The P-type work-function material may include tantalum nitride ($TaN_x$), aluminum nitride ($AlN_x$), or a combination thereof, and the N-type work function material may include titanium aluminum alloy.

In one embodiment, because the type of the fourth work function layer 817 is opposite to the type of the third work function layer 815, the third work function layer 815 may be able to significantly reduce the turn-on voltage of the third gate structure, and the fourth work function layer 817 may increase the turn-on voltage of the fourth gate structure. Therefore, under a same voltage, the circuit current controlled by the third gate structure may be large as compared to the circuit current controlled by the fourth gate structure. Under the combined action of the third threshold-voltage adjustment ions and the fourth threshold-voltage adjustment ions, balance between the circuit current controlled by the third gate structure and the circuit current controlled by the fourth gate structure can be improved. As such, the performance of the semiconductor structure is improved.

In one embodiment, the thickness of the third work function layer 815 may be in a range of approximately 30 Å to 130 Å. The thickness of the fourth work function layer 817 may be in a range of 0 Å to approximately 20 Å.

In one embodiment, the third gate structure may further include a preset work function layer (not shown), and the third work function layer 815 may be disposed on the preset work function layer. The fourth gate structure may further include a preset work function layer, and the fourth work function layer 817 may be disposed on the preset work function layer.

The material type of the preset work function layer may be the same as the device type of the semiconductor structure. When the semiconductor structure is a P-type device, the preset work function layer may be made of a P-type work-function material. When the semiconductor structure is an N-type device, the preset work function layer may be made of an N-type work-function material. The preset work function layer may reduce the turn-on voltages of the third gate structure and the fourth gate structure, such that the overall performance of the semiconductor structure may be improved.

In other embodiments, the semiconductor structure may not include the preset work function layer. That is, the preset work function layer may not be formed.

In one embodiment, the third gate dielectric layer and the fourth gate dielectric layer may be formed at the same time, and the third gate electrode layer 816 and the fourth gate electrode layer 818 may be formed at the same time.

Forming the third gate structure and the fourth gate structure may include the following exemplary steps. A gate dielectric material layer (not shown) may be formed on the substrate 300, the inner-wall surface of the third opening 311, the inner-wall surface of the fourth opening 312, and the inner-wall surface of the top opening 313. A preset work function layer (not shown) may be formed on the gate dielectric material layer, and a third work-function material layer (not shown) may be formed on the preset work function layer. The third work-function material layer formed on the surface of the fourth nanowire 304 may then be removed to form a third work function layer 815 on the third nanowire 302, and the fourth work-function material layer formed on the surface of the third work function layer 815 may be removed to form a fourth work function layer 817 on the fourth nanowire 304. A gate-electrode material layer (not shown) may be formed on the fourth work function layer 817 and the third work function layer 815. The gate-electrode material layer may fill up the third opening 311, the fourth opening 312, and the top opening 313. Further, the gate-electrode material layer, the work-function material layer, and the gate dielectric material layer may be planarized until the surface of the second isolation layer 314 is exposed. As such, the third gate structure and the fourth gate structure may be formed.

In one embodiment, the etching rate of the third work-function material layer may be different from the etching rate of the fourth work-function material layer, such that when removing the third work-function material layer, damage to the fourth work-function material layer may be limited, and when removing the fourth work-function material layer, damage to the third work-function material layer may be limited.

In one embodiment, the material of the preset work function layer may be the same as the material of the third work-function material layer. In one embodiment, the third work-function material layer may be removed by a wet etching process, and the fourth work-function material layer may be removed by a wet etching process. The wet etching process is an isotropic etching process, which may ensure that the work-function material layer can be fully removed.

The third work-function material layer may be formed by a CVD process or an ALD process. In one embodiment, the first work-function material layer may be formed by an ALD process. The ALD process may be able to ensure that the formed work function layers have low thickness, desired uniformity, and dense structure.

The fourth work-function material layer may be formed by a CVD process or an ALD process. In one embodiment, the fourth work-function material layer may be formed by an ALD process. The ALD process may be able to ensure that the formed work function layers have low thickness, desired uniformity, and dense structure.

The third gate dielectric layer and the fourth gate dielectric layer may be made of a same material. For example, the third gate dielectric layer and the fourth gate dielectric layer may be made of a high-K material (a high-K dielectric material refers to a dielectric material having a relative dielectric constant greater than 3.9). The high-K material may include hafnium oxide ($HfO_x$), aluminum oxide ($AlO_x$), or a combination thereof.

The third gate dielectric layer and the fourth gate dielectric layer may be formed by a CVD process or an ALD process. In one embodiment, the third gate dielectric layer and the fourth gate dielectric layer may be formed by an ALD process. The ALD process may be able to ensure that the formed gate dielectric layers have low thickness, desired uniformity, and dense structure.

The third gate electrode layer 816 and the fourth gate electrode layer 818 may be made of a same material. For example, the third gate electrode layer 816 and the fourth gate electrode layer 818 may be made of a metal, and the metal may include tungsten (W). The third gate electrode layer 816 and the fourth gate electrode layer 818 may be formed by a PVD process.

Further, a third isolation layer may be formed on the second isolation layer 314 and on the surface of the second gate structure. A source plug may be formed in the third isolation layer, the second isolation layer 314, and the source region 309. A drain plug may be formed in the third isolation layer, the second isolation layer 314, and the drain region 310. For the details of exemplary fabrication steps, processes, and materials, reference may be made to the FIG. 20 and the corresponding description in the embodiments provided above, which will not be repeated here.

Compared to existing semiconductor structures and fabrication methods, the disclosed semiconductor structures and fabrication methods may demonstrate the following exemplary advantages.

According to the disclosed semiconductor structure, the first nanowire contains first threshold-voltage adjustment ions, and the second nanowire contains second threshold-voltage adjustment ions. The first threshold-voltage adjustment ions may significantly increase the amount of electrons (e.g., the current) flowing through the first nanowire, such that the circuit current controlled by the first gate structure may be significantly increased. The second threshold-voltage adjustment ions may slightly increase the amount of electrons (e.g., the current) flowing through the second nanowire, such that the circuit current controlled by the second gate structure may be slightly increased. As such, the circuit current controlled by the second gate structure and the circuit current controlled by the second gate structure may become relatively balanced, thereby avoiding reduction in reliability of the semiconductor structure due to a large difference between the circuit current controlled by the first gate structure and the circuit current controlled by the second gate structure. Therefore, the performance of the semiconductor structure may be improved.

Further, the first gate structure includes a first work function layer, the second gate structure includes a second work function layer, different from the first work function layer. The first work function layer may be able to significantly reduce the turn-on voltage of the first gate structure, and the second work function layer may slightly reduce the turn-on voltage of the second gate structure. Therefore, under a same voltage, the circuit current controlled by the first gate structure may be large as compared to the circuit current controlled by the second gate structure. As such, balance between the circuit current controlled by the first gate structure and the circuit current controlled by the second gate structure can be improved.

According to the disclosed semiconductor structure, the fourth work function layer of a fourth gate structure is different from the third work function layer of a third gate structure. The third work function layer may be able to significantly reduce the turn-on voltage of the third gate structure, and the fourth work function layer may slightly reduce the turn-on voltage of the second gate structure. Therefore, under a same voltage, the circuit current controlled by the third gate structure may be large as compared to the circuit current controlled by the fourth gate structure. As such, the circuit current controlled by the third gate structure and the circuit current controlled by the fourth gate structure may become relatively balanced, thereby avoiding reduction in reliability of the semiconductor structure due to a large difference between the circuit current controlled by the third gate structure and the circuit current controlled by the fourth gate structure. Therefore, the performance of the semiconductor structure may be improved.

Further, the third nanowire contains third threshold-voltage adjustment ions, and the fourth nanowire contains fourth threshold-voltage adjustment ions. The type of the third threshold-voltage adjustment ions is opposite to the type of the fourth threshold-voltage adjustment ions. The third threshold-voltage adjustment ions may be able to significantly increase the amount of electrons (e.g., the current) flowing through the third nanowire, such that the circuit current controlled by the third gate structure may be significantly increased. The fourth threshold-voltage adjustment ions may slightly increase the amount of electrons (e.g., the current) flowing through the fourth nanowire, such that the circuit current controlled by the fourth gate structure may be slightly increased. As such, the circuit current controlled by the third gate structure and the circuit current controlled by the fourth gate structure may become relatively balanced.

The above-detailed descriptions only illustrate certain exemplary embodiments of the present disclosure, and are not intended to limit the scope of the present disclosure. Those skilled in the art can understand the specification as a whole and technical features in the various embodiments can be combined into other embodiments understandable to those persons of ordinary skill in the art. Any equivalent or modification thereof, without departing from the spirit and principle of the present disclosure falls within the true scope of the present disclosure.

What is claimed is:

1. A semiconductor structure, comprising:
   a substrate;
   a fin structure disposed on the substrate, wherein:
   the fin structure includes a channel region, a source region, and a drain region,
   the channel region is located between the source region and the drain region,
   the channel region includes a first nanowire and a second nanowire above the first nanowire,
   the first nanowire contains first threshold-voltage adjustment ions,
   the second nanowire contains second threshold-voltage adjustment ions,
   a first opening is formed between the first nanowire and the substrate, and between the source region and the drain region, and
   a second opening is formed between the first nanowire and the second nanowire, and between the source region and the drain region;

a first gate structure, formed in the first opening and across and surrounding the first nanowire, and including a first gate electrode layer and a first work function layer surrounding the first gate electrode layer; and a second gate structure, formed in the second opening and across and surrounding the second nanowire, and including a second electrode layer between the first nanowire and the second nanowire, and a second work function layer, the first work function layer covering a bottom surface and a part of sidewall surfaces of the second electrode layer, and the second work function layer covering a top surface and another part of the sidewall surfaces of the second electrode layer, wherein:

the first threshold-voltage adjustment ions are different from the second threshold-voltage adjustment ions in type, concentration, or a combination thereof; and a thickness of the first work function layer is higher than a thickness of the second work function layer, or a type of the first work function layer is opposite to a type of the second work function layer.

2. The semiconductor structure according to claim 1, wherein:

a type of the first threshold-voltage adjustment ions is opposite to a type of the second threshold-voltage adjustment ions;

when the semiconductor structure is N-type, the first threshold-voltage adjustment ions are N-type, and the second threshold-voltage adjustment ions are P-type; and when the semiconductor structure is P-type, the first threshold-voltage adjustment ions are P-type, and the second threshold-voltage adjustment ions are N-type.

3. The semiconductor structure according to claim 2, wherein:

a concentration of the first threshold-voltage adjustment ions is in a range of approximately 5.0E17 to 7.0E19 atoms per cubic centimeter (atom/cm$^3$); and a concentration of the second threshold-voltage adjustment ions is in a range of 0 to approximately 4.0E19 atom/cm$^3$.

4. The semiconductor structure according to claim 1, wherein:

a type of the first threshold-voltage adjustment ions is same as a type of the second threshold-voltage adjustment ions;

when the semiconductor structure is N-type, the first threshold-voltage adjustment ions and the second threshold-voltage adjustment ions are N-type;

when the semiconductor structure is P-type, the first threshold-voltage adjustment ions and the second threshold-voltage adjustment ions are P-type; and a concentration of the first threshold-voltage adjustment ions is higher than a concentration of the second threshold-voltage adjustment ions.

5. The semiconductor structure according to claim 4, wherein:

the concentration of the first threshold-voltage adjustment ions is in a range of approximately 1.5E18 to 1.0E20 atom/cm$^3$; and the concentration of the second threshold-voltage adjustment ions is in a range of 0 to approximately 8.0E19 atom/cm$^3$.

6. The semiconductor structure according to claim 1, wherein:

the type of the first work function layer is same as the type of the second work function layer;

when the semiconductor structure is N-type, the first work function layer and the second work function layer are made of an N-type work-function material;

when the semiconductor structure is P-type, the first work function layer and the second work function layer are made of a P-type work-function material; and the thickness of the first work function layer is higher than the thickness of the second work function layer, wherein:

the P-type work-function material includes tantalum nitride (TaN$_x$), aluminum nitride (AlN$_x$), or a combination thereof, and the N-type work-function material includes titanium aluminum alloy.

7. The semiconductor structure according to claim 6, wherein:

the thickness of the first work function layer is in a range of approximately 25 Å to 120 Å; and the thickness of the second work function layer is in a range of 0 Å to approximately 100 Å.

8. The semiconductor structure according to claim 1, wherein:

the type of the first work function layer is opposite to the type of the second work function layer;

when the semiconductor structure is N-type, the first work function layer is made of an N-type work-function material, and the second work function layer is made of a P-type work-function material; and when the semiconductor structure is P-type, the first work function layer is made of the P-type work-function material, and the second work function layer is made of the N-type work-function material, wherein:

the P-type work-function material includes tantalum nitride (TaN$_x$), aluminum nitride (AlN$_x$), or a combination thereof, and the N-type work-function material includes titanium aluminum alloy.

9. The semiconductor structure according to claim 8, wherein:

a thickness of the first work function layer is in a range of approximately 30 Å to 130 Å; and a thickness of the second work function layer is in a range of 0 Å to approximately 20 Å.

10. A method for forming a semiconductor structure, comprising:

forming a channel-region structure on a substrate, wherein:

the channel-region structure includes a first sacrificial layer disposed on the substrate, an initial first nanowire disposed on the first sacrificial layer, a second sacrificial layer disposed on the initial first nanowire, and an initial second nanowire disposed on the second sacrificial layer;

forming a first isolation layer on the substrate, the first isolation layer covering a portion of a sidewall surface of the first sacrificial layer;

forming a dummy gate structure on the substrate across the channel-region structure;

forming a source region and a drain region respectively on two sides of the channel-region structure;

forming a second isolation layer on the substrate, the second isolation layer covering a sidewall surface of the dummy gate structure and exposing a top surface of the dummy gate structure;

removing the dummy gate structure to form a top opening above the initial second nanowire, removing the first sacrificial layer and the second sacrificial layer to form a first opening between the initial first nanowire and the substrate and between the source region and the drain region and form a second opening between the initial second nanowire and the initial first nanowire and between the source region and the drain region; and doping first threshold-voltage adjustment ions into the initial first nanowire to form a first nanowire, and doping second threshold-voltage adjustment ions into the initial second nanowire to form a second nanowire;

forming a first gate structure in the first opening and across and surrounding the first nanowire, the first gate structure including a first gate electrode layer and a first work function layer surrounding the first gate electrode layer; and forming a second gate structure in the second opening and across and surrounding the second nanowire, the second gate structure including a second electrode layer between the first nanowire and the second nanowire, and a second work function layer, the first work function layer covering a bottom surface and a part of sidewall surfaces of the second electrode layer, and the second work function layer covering a top surface and another part of the sidewall surfaces of the second electrode layer, wherein:

the first threshold-voltage adjustment ions are different from the second threshold-voltage adjustment ions in type, concentration, or a combination thereof; and a thickness of the first work function layer is higher than a thickness of the second work function layer, or a type of the first work function layer is opposite to a type of the second work function layer.

* * * * *